United States Patent
Kimura et al.

(10) Patent No.: US 12,463,070 B2
(45) Date of Patent: Nov. 4, 2025

(54) PROCESSING APPARATUS FOR ELECTRONIC COMPONENT

(71) Applicant: UENO SEIKI CO., LTD., Fukuoka (JP)

(72) Inventors: Hiroyuki Kimura, Fukuoka (JP); Wataru Hirata, Fukuoka (JP)

(73) Assignee: UENO SEIKI CO., LTD., Fukuoka (JP)

( * ) Notice: Subject to any disclaimer, the term of this patent is extended or adjusted under 35 U.S.C. 154(b) by 22 days.

(21) Appl. No.: 18/606,571

(22) Filed: Mar. 15, 2024

(65) Prior Publication Data

US 2024/0222170 A1 Jul. 4, 2024

Related U.S. Application Data

(63) Continuation of application No. PCT/JP2022/032472, filed on Aug. 29, 2022.

(30) Foreign Application Priority Data

Sep. 17, 2021 (JP) .................. 2021-152325

(51) Int. Cl.
*H01L 21/67* (2006.01)
*H01L 21/68* (2006.01)
(Continued)

(52) U.S. Cl.
CPC .. *H01L 21/67259* (2013.01); *H01L 21/67271* (2013.01); *H01L 21/67288* (2013.01);
(Continued)

(58) Field of Classification Search
CPC ........ G01B 11/30; G01N 21/84; G01N 21/89; G01N 21/01; G01N 2201/0415;
(Continued)

(56) References Cited

U.S. PATENT DOCUMENTS 4,309,702 A * 1/1982 Mibu ................ G01D 5/243
340/870.18
7,065,240 B2 * 6/2006 Tada .................... G02B 7/34
356/239.8
(Continued)

FOREIGN PATENT DOCUMENTS

JP 2002-372496 A 12/2002
JP 2004-212067 A 7/2004
(Continued)

OTHER PUBLICATIONS

International Search Report (PCT/ISA/210) dated Nov. 15, 2022, issued by the International Searching Authority in counterpart International Application No. PCT/JP2022/032472.
(Continued)

*Primary Examiner* — Michael A Lyons
*Assistant Examiner* — Judy Dao Tran
(74) *Attorney, Agent, or Firm* — Sughrue Mion, PLLC

(57) ABSTRACT

A processing apparatus for an electronic component includes a component holding portion that holds an electronic component, a support portion that supports the component holding portion such that the component holding portion is located on a circular orbit passing through a predetermined inspection position, a transport drive unit that rotates the support portion about a central axis of the circular orbit, an imaging unit that is configured to image an inspection surface of the electronic component held by the component holding portion disposed at the inspection position, a position sensor that acquires position information indicating a position of the inspection surface, and a focus adjustment unit that adjusts a focus of the imaging unit on the inspection surface.

12 Claims, 13 Drawing Sheets

(51) Int. Cl.
*H04N 23/67* (2023.01)
*G01N 21/01* (2006.01)
*G06T 7/00* (2017.01)
*G06T 7/70* (2017.01)
*H01L 21/677* (2006.01)

(52) U.S. Cl.
CPC ........... *H01L 21/681* (2013.01); *H04N 23/67* (2023.01); *G01N 21/01* (2013.01); *G01N 2201/0415* (2013.01); *G06T 7/0004* (2013.01); *G06T 7/70* (2017.01); *H01L 21/67* (2013.01); *H01L 21/677* (2013.01); *H01L 21/68* (2013.01); *H01L 2224/95121* (2013.01)

(58) Field of Classification Search
CPC ......... H01L 21/67259; H01L 21/67271; H01L 21/67288; H01L 21/681; H01L 21/67; H01L 21/677; H01L 21/68; H01L 2224/95121; H04N 23/67; G06T 7/0004; G06T 7/70
See application file for complete search history.

(56) References Cited

U.S. PATENT DOCUMENTS

| | | | |
|---|---|---|---|
| 7,884,949 B2* | 2/2011 | Koh ....................... | G01B 11/25 356/601 |
| 2005/0175233 A1* | 8/2005 | Yoneyama ........... | G02B 21/245 382/145 |
| 2014/0071457 A1* | 3/2014 | Cai ....................... | G01N 21/956 356/498 |
| 2018/0364180 A1* | 12/2018 | Cheng ................... | G06T 7/0004 |
| 2022/0404173 A1* | 12/2022 | Watanabe ............ | G01D 5/2013 |

FOREIGN PATENT DOCUMENTS

| | | | |
|---|---|---|---|
| JP | 2009-14696 A | | 1/2009 |
| JP | 2009014696 A | * | 1/2009 |
| JP | 2016-99236 A | | 5/2016 |
| JP | 6860249 B1 | | 4/2021 |
| JP | 6885554 B1 | | 6/2021 |
| WO | 2016/080061 A1 | | 5/2016 |

OTHER PUBLICATIONS

Written Opinion (PCT/ISA/237) dated Nov. 15, 2022, issued by the International Searching Authority in counterpart International Application No. PCT/JP2022/032472.

English Translation of the Written Opinion dated Nov. 15, 2022, issued by the International Searching Authority in International Application No. PCT/JP2022/032472.

* cited by examiner

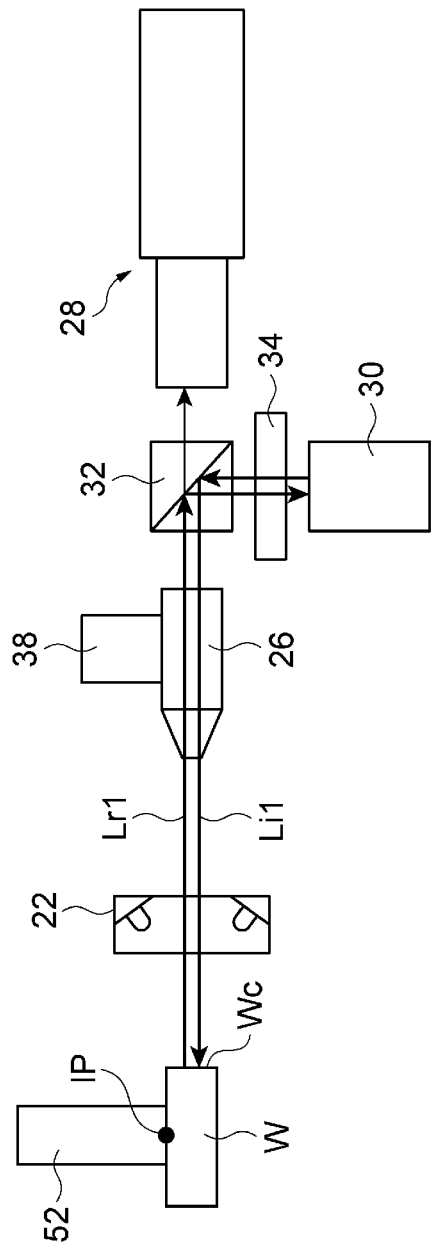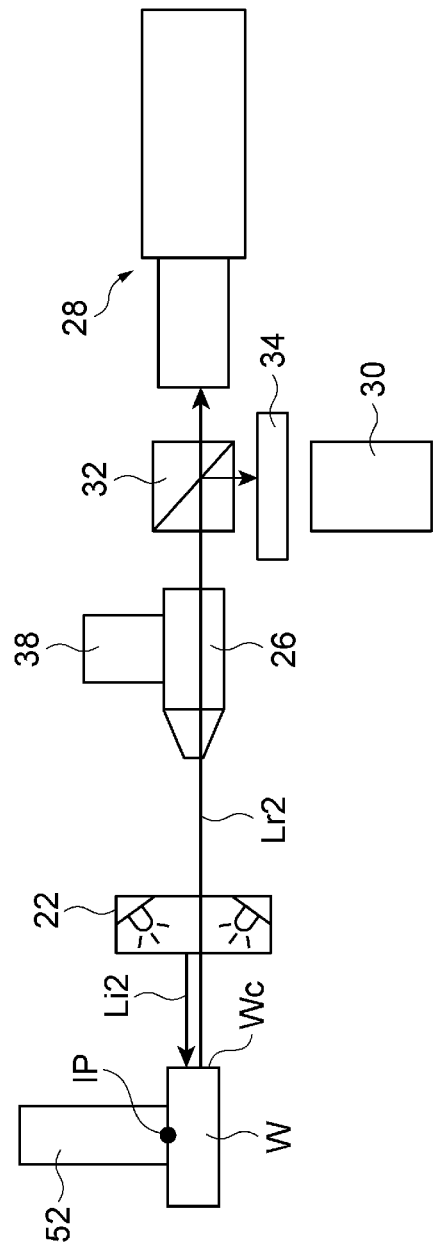

PROCESSING APPARATUS FOR ELECTRONIC COMPONENT

CROSS-REFERENCE TO RELATED APPLICATIONS

The present application is a continuation application of PCT/JP2022/032472 that claims priority to Japanese Patent Application No. 2021-152325 filed on Sep. 17, 2021, the entire content of which is incorporated herein by reference.

TECHNICAL FIELD

The disclosure relates to a processing apparatus for an electronic component.

BACKGROUND

JP2016099236A discloses a visual inspection apparatus that performs a visual inspection of a side portion of an electronic component. The visual inspection apparatus includes a rotating body on which a plurality of support portions that respectively hold a plurality of electronic components are intermittently rotated about a rotation axis to dispose the electronic components at imaging positions, and imaging means for imaging a side portion of the electronic component disposed at the imaging position.

SUMMARY

The disclosure provides a processing apparatus for an electronic component, which is useful for improving inspection accuracy.

According to one aspect of the disclosure, a processing apparatus for an electronic component includes a component holding portion that holds an electronic component, a support portion that supports the component holding portion such that the component holding portion is located on a circular orbit passing through a predetermined inspection position, a transport drive unit that rotates the support portion about a central axis of the circular orbit, an imaging unit that is configured to image an inspection surface of the electronic component held by the component holding portion disposed at the inspection position, a position sensor that acquires position information indicating a position of the inspection surface, and a focus adjustment unit that adjusts a focus of the imaging unit on the inspection surface.

According to the disclosure, a processing apparatus for an electronic component which is useful for improving an inspection accuracy is provided.

BRIEF DESCRIPTION OF DRAWINGS

FIG. 6A is a schematic view showing an example of an optical path formed when measuring a position of an inspection surface.

FIG. 6B is a schematic view showing an example of an optical path formed when imaging the inspection surface.

DESCRIPTION OF EMBODIMENTS

Figure 1:
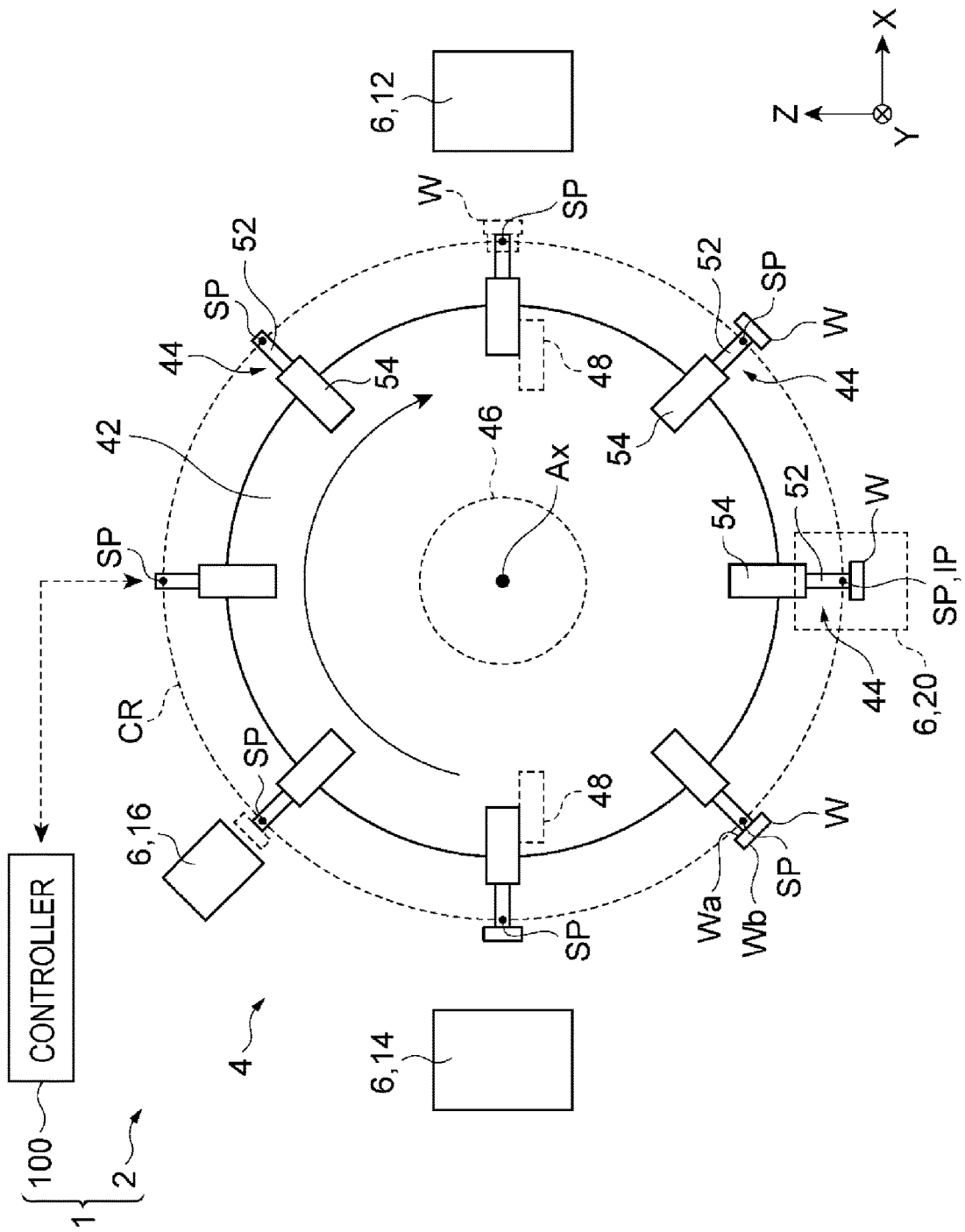
FIG. 1 is a side view schematically showing an example of a processing apparatus for an electronic component according to a first embodiment.

Exemplary embodiments will be described with reference to drawings. In the description, the same elements or elements having the same function are denoted by the same reference numerals, and redundant description thereof will be omitted. An XYZ rectangular coordinate system is shown in the drawings as necessary. For example, an X axis and a Y axis are in a horizontal direction, and a Z axis is in a vertical direction.

First Embodiment

Figure 2:
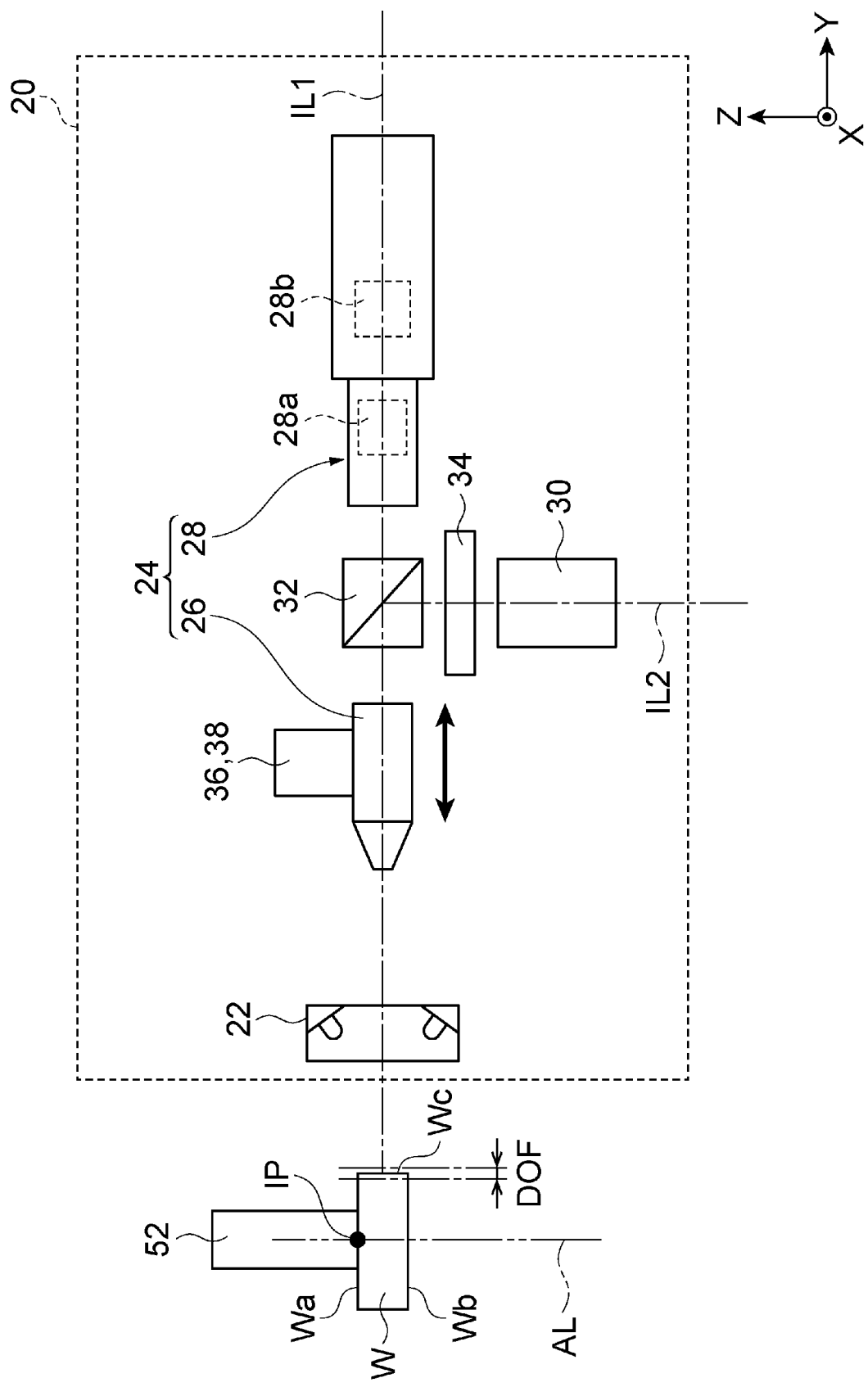
FIG. 2 is a schematic view showing an example of a visual inspection unit.

A processing apparatus for an electronic component according to a first embodiment will be described with reference to FIGS. 1 to 9. A processing apparatus 1 for the electronic component shown in FIGS. 1 and 2 is a so-called die sorter. The processing apparatus 1 is an apparatus that performs processing such as a visual inspection on a plurality of electronic components W while sequentially transporting the electronic components W, and then packs the electronic components W into an accommodation member such as a wafer sheet, a carrier tape, or a tray. The electronic component W to be processed is, for example, a component that is formed in a front-end process of semiconductor manufacturing and then is separated into individual pieces by dicing or the like.

As shown in FIG. 1, the processing apparatus 1 includes a transport processing unit 2 and a controller 100. The transport processing unit 2 is a unit that performs predetermined processing on the electronic component W while transporting the electronic component W. The transport processing unit 2 includes a rotation transport unit 4 and a plurality of processing units 6.

Rotation Transport Unit: The rotation transport unit 4 transports the electronic component W along a predetermined circular orbit CR. The electronic component W to be transported has, for example, main surfaces Wa and Wb that are parallel to each other (in opposite directions), and four side surfaces Wc that connect the main surface Wa and the main surface Wb (see also FIG. 2). Each side surface Wc may be orthogonal to the main surfaces Wa and Wb. Each side surface Wc may be formed in a planar shape. The rotation transport unit 4 includes, for example, a support portion 42, a plurality of component holding portions 44, a transport drive unit 46, and a plurality of advance/retract drive units 48.

The support portion 42 supports the plurality of component holding portions 44. The support portion 42 supports the plurality of component holding portions 44 such that each of the component holding portions 44 is located on the predetermined circular orbit CR. The support portion 42 is provided to be rotatable about a central axis Ax of the circular orbit CR. The circular orbit CR may be a vertical circular orbit, and the central axis Ax may be a horizontal axial line (may extend along one horizontal direction). The support portion 42 is, for example, a turntable.

The plurality of component holding portions 44 are disposed at equal intervals along a circumference centered on the central axis Ax, and are fixed to the support portion 42. Each of the plurality of component holding portions 44 holds the electronic component W. The component holding portion 44 may hold the electronic component W using any method. The component holding portion 44 vacuum-sucks any of the main surfaces Wa and Wb, for example, from one side in a radial direction of the circumference centered on the central axis Ax. In the following description, the terms "inside" and "outside" are used with respect to the central axis of the circular orbit. The component holding portion 44 has a suction portion 52 and a holder 54.

The suction portion 52 (component holding portion) is formed to extend along the radial direction of the circular orbit CR. The suction portion 52 is provided (is fixed) on the support portion 42 via the holder 54 such that a suction surface faces an outside of the circular orbit CR. The suction portion 52 is provided on the support portion 42 such that a tip portion including the suction surface is located on the circular orbit CR. The suction portion 52 sucks one main surface (for example, the main surface Wa) of the electronic component W such that the electronic component W is located on an outer side of the suction portion 52. In this case, the central axis Ax, the suction portion 52, and the electronic component W are arranged in this order along a radius of the circular orbit CR. The holder 54 holds the suction portion 52 displaceably and is fixed to an outer peripheral portion of the support portion 42.

The transport drive unit 46 is configured to rotate the support portion 42 about the central axis Ax of the circular orbit CR. The transport drive unit 46 uses a power source such as an electric motor to rotate the support portion 42 about the central axis Ax through direct drive without using gears. The plurality of component holding portions 44 (a plurality of the suction portions 52) move along the vertical circular orbit CR about the central axis Ax by the rotation of the support portion 42. As a result, the electronic component W held by the component holding portion 44 is transported along the circular orbit CR.

The transport drive unit 46 is controlled to repeat rotation and stop of the support portion 42 at an angle pitch (angle pitch around the central axis Ax) between the component holding portions 44 adjacent to each other on the circular orbit CR. Hereinafter, a plurality of positions at which the plurality of component holding portions 44 are respectively disposed when the transport drive unit 46 stops the support portion 42 are referred to as "a plurality of stop positions SP". For example, in a state where the component holding portion 44 is disposed at the stop position SP, the suction portion 52 of the component holding portion 44 is located at the stop position SP.

The plurality of advance/retract drive units 48 are disposed to correspond to several stop positions SP, respectively. The advance/retract drive unit 48 is configured to move the component holding portion 44 along the radial direction of the circular orbit CR at the corresponding stop position SP. The advance/retract drive unit 48 moves the suction portion 52 of the component holding portion 44 from the central axis Ax toward the outside of the circular orbit CR at the corresponding stop position SP, for example.

The stop position SP at which the suction portion 52 does not need to be moved along the radial direction of the circular orbit CR does not have to be provided with the advance/retract drive unit. The plurality of advance/retract drive units 48 are provided so as not to move with the rotation of the support portion 42. The advance/retract drive unit 48 is located inside the component holding portion 44 in a state of being disposed at the corresponding stop position SP. The advance/retract drive units 48 move the component holding portions 44 that are sequentially disposed at the corresponding stop positions SP outward along the radial direction of the circular orbit CR.

Processing Unit: The plurality of processing units 6 are provided to correspond to several stop positions SP, respectively. The processing unit 6 is configured to perform predetermined processing on the electronic component W held by the component holding portion 44 disposed at the corresponding stop position SP. In the present disclosure, the term "processing" performed on the electronic component W includes any act of changing a state of the electronic component W.

In one example, applying marking or the like on the electronic component W, holding (sending) the electronic component W by the component holding portion 44, and collecting (receiving) the electronic component W from the component holding portion 44 correspond to the "processing". In addition, executing some kind of inspection on the electronic component W also corresponds to the "processing" because inspection data is changed from an unknown state to a known state. The plurality of processing units 6 include, for example, a component supply unit 12, a component collecting unit 14, and a visual inspection unit 20.

The component supply unit 12 is a unit that supplies the electronic component W to the rotation transport unit 4. The component supply unit 12 is disposed to correspond to any of the stop positions SP, and supplies the electronic component W to the component holding portion 44 disposed at the stop position SP. Hereinafter, the stop position SP at which the electronic component W is supplied from the component supply unit 12 to the rotation transport unit 4 is referred to as a "stop position SP for supply". The stop position SP for supply may be located at one end part in a horizontal direction (for example, an X axis direction shown in the drawing) perpendicular to the central axis Ax. At the stop position SP for supply, the component holding portion 44 moves along the radial direction of the circular orbit CR by the above-described advance/retract drive unit 48 to receive the electronic component W.

The component supply unit 12 supplies the electronic components W to the rotation transport unit 4 from, for example, a wafer sheet to which the plurality of electronic components W are attached. The component supply unit 12 sequentially transports each of the plurality of electronic components W attached to the wafer sheet to a position facing the suction portion 52 disposed at the stop position SP for supply. In a state where one electronic component W on the wafer sheet is transported to a position facing the suction portion 52, the suction portion 52 receives the electronic component W from the component supply unit 12 while moving in the radial direction of the circular orbit CR by the advance/retract drive unit 48. The suction portion 52 receives the electronic component W at the stop position SP for supply, whereby the electronic component W is supplied from the component supply unit 12 to the rotation transport unit 4.

The component collecting unit 14 is a unit for collecting the electronic component W from the rotation transport unit 4. The component collecting unit 14 is disposed to correspond to any stop position SP other than the stop position SP for supply, and receives the electronic component W from the component holding portion 44 disposed at the stop position SP. Hereinafter, the stop position SP at which the electronic component W is collected from the rotation transport unit 4 to the component collecting unit 14 is referred to as a "stop position SP for collect". The stop position SP for collect may be located at the other end part opposite to the stop position SP for supply in the horizontal direction perpendicular to the central axis Ax. At the stop position SP for collecting, the component holding portion 44 moves along the radial direction of the circular orbit CR by the above-described advance/retract drive unit 48 to receive the electronic component W.

The component collecting unit 14 collects the electronic components W from the rotation transport unit 4 to a wafer sheet capable of collecting the plurality of electronic components W through attachment, for example. The component collecting unit 14 sequentially transports each of a plurality of regions to be attached on the wafer sheet to a position facing the suction portion 52 disposed at the stop position SP for collect. In a state where one region to be accommodated on the wafer sheet is transported to a position facing the suction portion 52, the suction portion 52 delivers the electronic component W to the component collecting unit 14 while moving in the radial direction of the circular orbit CR by the advance/retract drive unit 48. The suction portion 52 delivers the electronic component W at the stop position SP for collect, whereby the electronic component W is collected from the rotation transport unit 4 to the component collecting unit 14.

In the above-described example, the stop position SP for supply, the central axis Ax, and the stop position SP for collect are arranged in this order in the horizontal direction. The electronic component W supplied to the stop position SP for supply may be transported to the stop position SP for collect through the stop position SP located at the lowest position. That is, the rotation transport unit 4 may transport the electronic component W on the lower half of the circular orbit CR.

Appearance Inspection Unit: The visual inspection unit 20 is a unit that performs a visual inspection on the electronic component W at any stop position SP located on a route (a route on which the electronic component W is transported) between the stop position SP for supply and the stop position SP for return in the circular orbit CR. Hereinafter, the stop position SP at which the visual inspection is performed by the visual inspection unit 20 is referred to as an "inspection position IP". For example, the stop position SP located at the lowest position is set as the inspection position IP. The circular orbit CR passes through the inspection position IP.

The visual inspection unit 20 may perform the visual inspection on any surface included in the electronic component W. In one example, one side surface Wc of the electronic component W is set as an inspection target surface by the visual inspection unit 20. In the visual inspection by the visual inspection unit 20, the presence or absence of an abnormality on the inspection target surface is inspected. Specific examples of the abnormality include generation of a crack, generation of a scratch or chipping, and adhesion of a foreign matter. The visual inspection unit 20 generates image data for inspection by imaging the side surface Wc (inspection surface) to be inspected.

The side surface Wc to be inspected may be a side surface facing one side of a direction in which the central axis Ax extends (for example, a Y axis direction shown in the drawing), and the visual inspection unit 20 may be disposed to face the side surface. FIG. 2 is a schematic view showing an example of the visual inspection unit 20. The visual inspection unit 20 includes, for example, an illumination unit 22, an imaging unit 24, and a focus adjustment unit 36.

FIG. 2 shows an imaginary line IL1, which is an imaginary line that is parallel to the central axis Ax (or the Y axis direction) and that passes through the electronic component W in a state of being disposed at the inspection position IP. The imaginary line IL1 passes through a center of the electronic component W held in an ideal state. The electronic component W, the illumination unit 22, and the imaging unit 24 are disposed in this order along the imaginary line IL1. The illumination unit 22 is configured to irradiate the side surface Wc to be inspected with light for imaging. The light emitted from the illumination unit 22 is reflected by the side surface Wc to be inspected, and a part of the reflected light generated with the reflection reaches the imaging unit 24. The light emitted from the illumination unit 22 may be visible light. The illumination unit 22 is formed so as not to block the progress of light between the electronic component W and the imaging unit 24.

The imaging unit 24 images an inspection target surface of the electronic component W held by the component holding portion 44 disposed at the inspection position IP. The imaging unit 24 is configured to execute imaging of the side surface Wc to be inspected by forming an image of the reflected light emitted from the side surface Wc to be inspected. The imaging unit 24 includes, for example, an objective lens 26 and a camera 28. The objective lens 26 and the camera 28 are spaced apart from each other, and the camera 28 holds the objective lens 26 with the side surface Wc to be inspected along the imaginary line IL1. The objective lens 26 is a lens (optical component) disposed closest to the side surface Wc, which is a subject to be imaged by the imaging unit 24.

The camera 28 is provided to be capable of imaging the side surface Wc of the electronic component W to be inspected held by the component holding portion 44 disposed at the inspection position IP. The camera 28 may be capable of imaging the entire side surface Wc to be inspected. The camera 28 may include a lens 28$a$ and an imaging element 28$b$. The lens 28$a$ is an optical component that forms an image of light incident into the camera 28 on the imaging element 28$b$. The imaging element 28$b$ is a charge coupled device (CCD) image sensor or a complementary metal oxide semiconductor (CMOS) image sensor.

In the imaging unit 24, the reflected light from the inspection target surface can be imaged on the imaging element 28$b$ by a plurality of optical components including the objective lens 26 and the lens 28$a$. Image data (imaging data) of the side surface Wc to be inspected is obtained by forming an image of the reflected light from the inspection target. The imaging unit 24 may be configured to be capable of adjusting a relative distance between at least one optical component included in the imaging unit 24 and the imaging element 28$b$. A focus of the imaging unit 24 may be adjusted on the side surface Wc to be inspected by the change in the relative distance.

The focus adjustment unit 36 is configured to adjust the focus of the imaging unit 24 on the side surface Wc to be inspected. The focus adjustment unit 36 drives the imaging unit 24, for example, to adjust the focus of the imaging unit 24 on the side surface Wc to be inspected. Driving the imaging unit 24 means moving the imaging unit 24 itself or moving at least one component included in the imaging unit 24. The at least one component includes an optical component or an imaging element.

The focus adjustment unit 36 may include a drive unit 38 that moves the objective lens 26. The drive unit 38 changes a position of the objective lens 26 along a direction in which the side surface Wc to be inspected and the camera 28 are arranged (imaginary line IL1). A focal position of the imaging unit 24 with respect to the inspection position IP is changed by changing the position of the objective lens 26 along the imaginary line IL1. As a result, the focus of the imaging unit 24 can be adjusted on the side surface Wc of the electronic component W to be inspected held by the component holding portion 44 disposed at the inspection position IP. The drive unit 38 may be a drive unit of any drive type, and is, for example, a piezo actuator including a piezo (piezoelectric element).

In FIG. 2, a depth of field by the imaging unit 24 is indicated by "DOF". The depth of field DOF is a range on the imaginary line IL1, and is a range in which the imaging unit 24 forms an image of the subject in a state where the subject is substantially in focus. When the subject, that is, the side surface Wc to be inspected is included in the depth of field DOF, the image of the side surface Wc is formed on the imaging element 28b without being blurred. When the side surface Wc to be inspected is out of the depth of field DOF, the image of the side surface Wc is blurred to such an extent that the visual inspection of the side surface Wc cannot be performed on an image forming plane of the imaging element 28b. A position of the depth of field DOF is changed by the change in the focal position of the imaging unit 24. A size (width) of the depth of field DOF changes depending on the optical system, such as the lens, included in the imaging unit 24. The optical system of the imaging unit 24 may be selected depending on inspection accuracy required in the visual inspection.

The visual inspection unit 20 includes a branch portion 32, a position sensor 30, and a filter portion 34. The branch portion 32 is disposed between the objective lens 26 and the camera 28 along the imaginary line IL1. FIG. 2 shows an imaginary line IL2, which is an imaginary line that is orthogonal to the imaginary line IL1 and that extends vertically downward from a point at which the branch portion 32 is disposed. The branch portion 32, the filter portion 34, and the position sensor 30 are arranged in this order along the imaginary line IL2.

The branch portion 32 branches the light emitted from the side surface Wc to be inspected along the imaginary line IL1. For example, the branch portion 32 branches the light from the side surface Wc to be inspected into first light that travels directly to the camera 28 along the imaginary line IL1 and second light that travels to the position sensor 30 along the imaginary line IL2. The branch portion 32 is, for example, a beam splitter or a half mirror.

The position sensor 30 is a sensor that acquires information indicating a position of the side surface Wc to be inspected (hereinafter, referred to as "position information"). The position information is information indicating a position of a side surface Wc of the electronic component W held by the suction portion 52. The position sensor 30 acquires the above-described position information in a state where the component holding portion 44 that holds the electronic component W to be inspected is disposed at the inspection position IP (at a timing when the component holding portion 44 is disposed at the inspection position IP). The position sensor 30 is, for example, a sensor that measures a distance using laser light.

The position sensor 30 is configured to irradiate the side surface Wc to be inspected with laser light and to receive the reflected light from the side surface Wc generated by the irradiation. The position sensor 30 irradiates the branch portion 32 with laser light along the imaginary line IL2. The laser light with which the branch portion 32 is irradiated travels toward the side surface Wc to be inspected through the branch portion 32. Reflected light of the laser light emitted from the side surface Wc to be inspected travels toward the branch portion 32, is branched in the branch portion 32, and then reaches the position sensor 30.

A distance on an optical path between the position sensor 30 and the side surface Wc to be inspected is measured based on a difference between a timing when the position sensor 30 emits the laser light and a timing when the position sensor 30 receives the reflected light of the laser light. The filter portion 34 is a band-pass filter. The filter portion 34 is configured to transmit light having a frequency range of the laser light used by the position sensor 30 for distance measurement and to not transmit light having a frequency other than the frequency range (to attenuate the light).

The presence or absence of an abnormality on the inspection target surface is determined based on the image data obtained by imaging the inspection target surface by the visual inspection unit 20. As shown in FIG. 1, the rotation transport unit 4 may include a component discharge unit 16. The component discharge unit 16 is disposed, for example, to correspond to the stop position SP located downstream of the inspection position IP. In the rotation transport unit 4, the electronic component W is transported from the upstream side to the downstream side along the circular orbit CR. The component discharge unit 16 is a unit for picking up the electronic component W in which an abnormality has been detected on the inspection target surface.

Controller: The controller 100 controls the transport processing unit 2. The controller 100 is configured of one or a plurality of control computers. The controller 100 controls the transport processing unit 2 according to a predetermined control procedure such that the plurality of electronic components W are sequentially subjected to predetermined processing.

Figure 3:
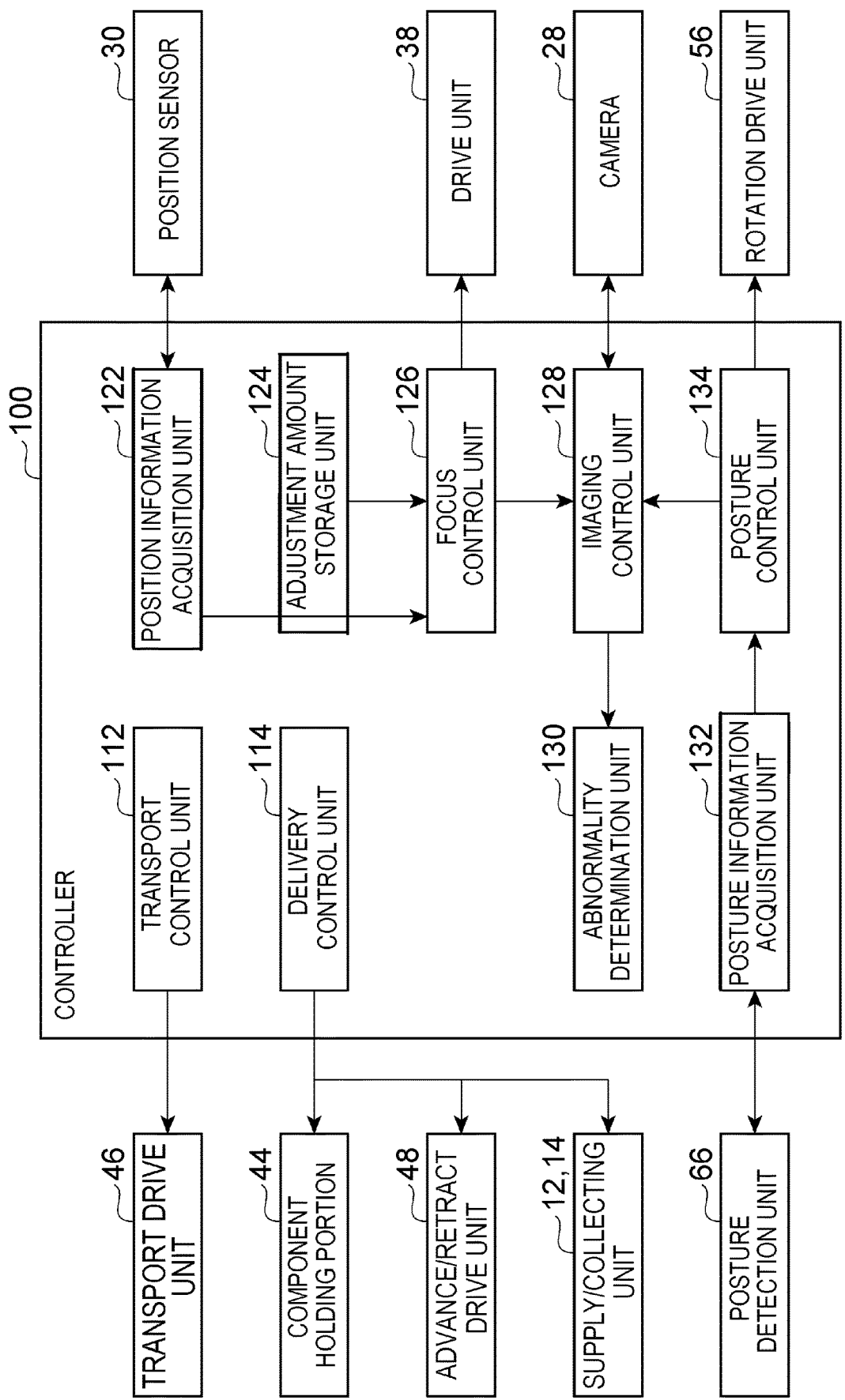
FIG. 3 is a block diagram showing an example of a functional configuration of a controller.

As a functional configuration (hereinafter, referred to as a "functional module"), for example, as shown in FIG. 3, the controller 100 includes a transport control unit 112, a delivery control unit 114, a position information acquisition unit 122, an adjustment amount storage unit 124, a focus control unit 126, an imaging control unit 128, and an abnormality determination unit 130. The processing executed by these functional modules corresponds to the processing executed by the controller 100. Hereinafter, the processing executed by each functional module (controller 100) is referred to as "control processing" in order to distinguish the processing from the processing performed on the electronic component W by the processing unit 6.

The transport control unit 112 controls the transport drive unit 46 to repeat rotation and stop of the support portion 42 at the angle pitch between the component holding portions 44 adjacent to each other on the circular orbit CR. The rotation and the stop of the support portion 42 are alternately repeated, so that the stop of the component holding portion 44 (suction portion 52) at the stop position SP and the movement of the component holding portion 44 (suction portion 52) from the stop position SP to the next stop position SP are repeated.

The delivery control unit 114 controls the component holding portion 44, the advance/retract drive unit 48, and the component supply unit 12 such that the electronic component W is supplied to the rotation transport unit 4 at the stop position SP for supply. The delivery control unit 114 controls the component holding portion 44, the advance/retract drive unit 48, and the component collecting unit 14 such that the electronic component W is collected from the rotation transport unit 4 at the stop position SP for collect.

The position information acquisition unit 122 acquires the above-described position information indicating the position of the side surface Wc to be inspected, from the position sensor 30. For example, after the suction portion 52 that holds the electronic component W to be inspected is disposed at the inspection position IP, the position information acquisition unit 122 causes the position sensor 30 to irradiate the side surface Wc to be inspected with the laser light, and causes the position sensor 30 to receive the reflected light of the laser light from the side surface Wc. The position information acquisition unit 122 acquires the position information according to a difference between a timing when the irradiation with the laser light is started and a timing when the reflected light of the laser light is received.

The adjustment amount storage unit 124 stores information indicating a drive amount of the imaging unit 24. The adjustment amount storage unit 124 stores, for example, a table in which a deviation amount between the position of the side surface Wc to be inspected indicated by the position information and a reference position, and the drive amount of the imaging unit 24 are associated with each other. The table in which the above-described deviation amount and drive amount are associated with each other may be prepared in advance by an operator or the like. The reference position of the side surface Wc to be inspected is, for example, a theoretical (designed) position of the side surface Wc of the electronic component W held by the suction portion 52. In a case where the side surface Wc to be inspected is located at the reference position, the side surface Wc to be inspected is included in the depth of field DOF even without performing the focus adjustment of the imaging unit 24. The drive amount is set such that the depth of field DOF changes (moves) to a range including the side surface Wc to be inspected even in a case where the position of the side surface Wc to be inspected along the imaginary line IL1 deviates from the reference position.

The focus control unit 126 controls the focus adjustment unit 36 to adjust the focus of the imaging unit 24 on the side surface Wc to be inspected. The focus control unit 126 moves the objective lens 26 along the imaginary line IL1 by the drive unit 38 of the objective lens 26 based on, for example, the drive amount corresponding to the position information indicating the position of the side surface Wc. As a result, even in a case where the side surface Wc to be inspected is not included in the depth of field DOF before the visual inspection, the depth of field DOF can change to the range including the side surface Wc to be inspected. A situation in which the side surface Wc to be inspected is not included in the depth of field DOF may be caused by individual differences in the electronic components W, individual differences in the suction portions 52, or a deviation of the electronic component W held by the suction portion 52 from an ideal holding position.

The imaging control unit 128 controls the camera 28 to acquire the image data of the side surface Wc to be inspected. The imaging control unit 128 causes the imaging unit 24 to execute the imaging of the side surface Wc after the objective lens 26 is driven by the drive unit 38 of the focus adjustment unit 36. The focus control unit 126 and the imaging control unit 128 cause the drive unit 38 and the imaging unit 24 to execute the focus adjustment through the movement of the objective lens 26 and the imaging by the camera 28, respectively, each time any one of the plurality of component holding portions 44 (suction portions 52) is disposed at the inspection position IP. In this case, the imaging unit 24 images the side surface Wc to be inspected after the focus adjustment of the imaging unit 24 is performed by the focus adjustment unit 36, each time any of the suction portions 52 is disposed at the inspection position IP. In a case where the focus adjustment of the imaging unit 24 and the imaging by the imaging unit 24 are repeated for each electronic component W, the drive amount of the imaging unit 24 may be zero depending on the position of the side surface Wc indicated by the position information.

The abnormality determination unit 130 determines the presence or absence of an abnormality in the side surface Wc to be inspected, based on the image data obtained by imaging the side surface Wc. The abnormality determination unit 130 determines, for example, whether a fine crack or chipping has occurred in the side surface Wc to be inspected based on the image data. A width of the crack or the chipping that is required to be detected may be about 0.1 μm to 3.5 μm. As the width of the crack or the like is finer, it is necessary to acquire a high-resolution image in order to detect the crack or the like. In a case where the optical system of the imaging unit 24, such as a lens, capable of acquiring a high-resolution image is selected, the depth of field DOF tends to be narrow. In this case, a situation in which the side surface Wc is not included in the depth of field DOF may occur because of a slight deviation of the side surface Wc to be inspected from the reference position.

Figure 4:
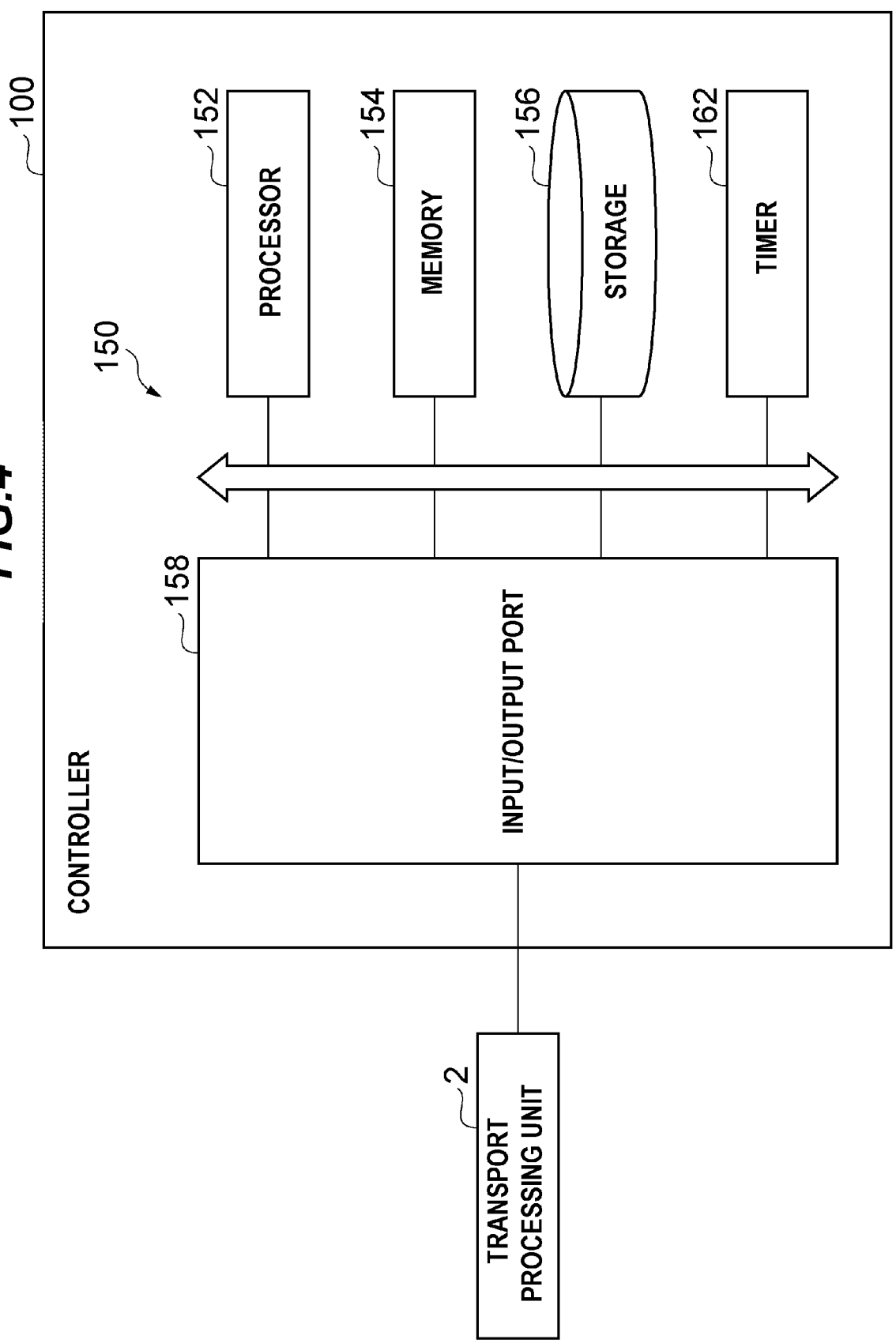
FIG. 4 is a block diagram showing an example of a hardware configuration of the controller.

As shown in FIG. 4, the controller 100 includes a circuit 150. The circuit 150 includes one or a plurality of processors 152, a memory 154, a storage 156, an input/output port 158, and a timer 162. The storage 156 has a computer-readable storage medium, such as a non-volatile semiconductor memory. The storage 156 stores a program for causing the controller 100 to execute control of each element included in the transport processing unit 2 according to a preset control procedure. For example, the storage 156 stores a program for configuring each of the above-described functional modules.

The memory 154 temporarily stores a program loaded from the storage medium of the storage 156 and an operation result by the processor 152. The processor 152 executes the program in cooperation with the memory 154 to configure each functional module of the controller 100. The input/output port 158 inputs and outputs an electric signal to and from each element of the transport processing unit 2 in response to a command from the processor 152.

The timer 162 measures an elapsed time, for example, by counting a reference pulse having a constant period. The circuit 150 is not necessarily limited to being configured to implement each function via the program. For example, the circuit 150 may implement at least a part of the functions using a dedicated logic circuit or an application specific integrated circuit (ASIC) in which the dedicated logic circuits are integrated.

Figure 5:
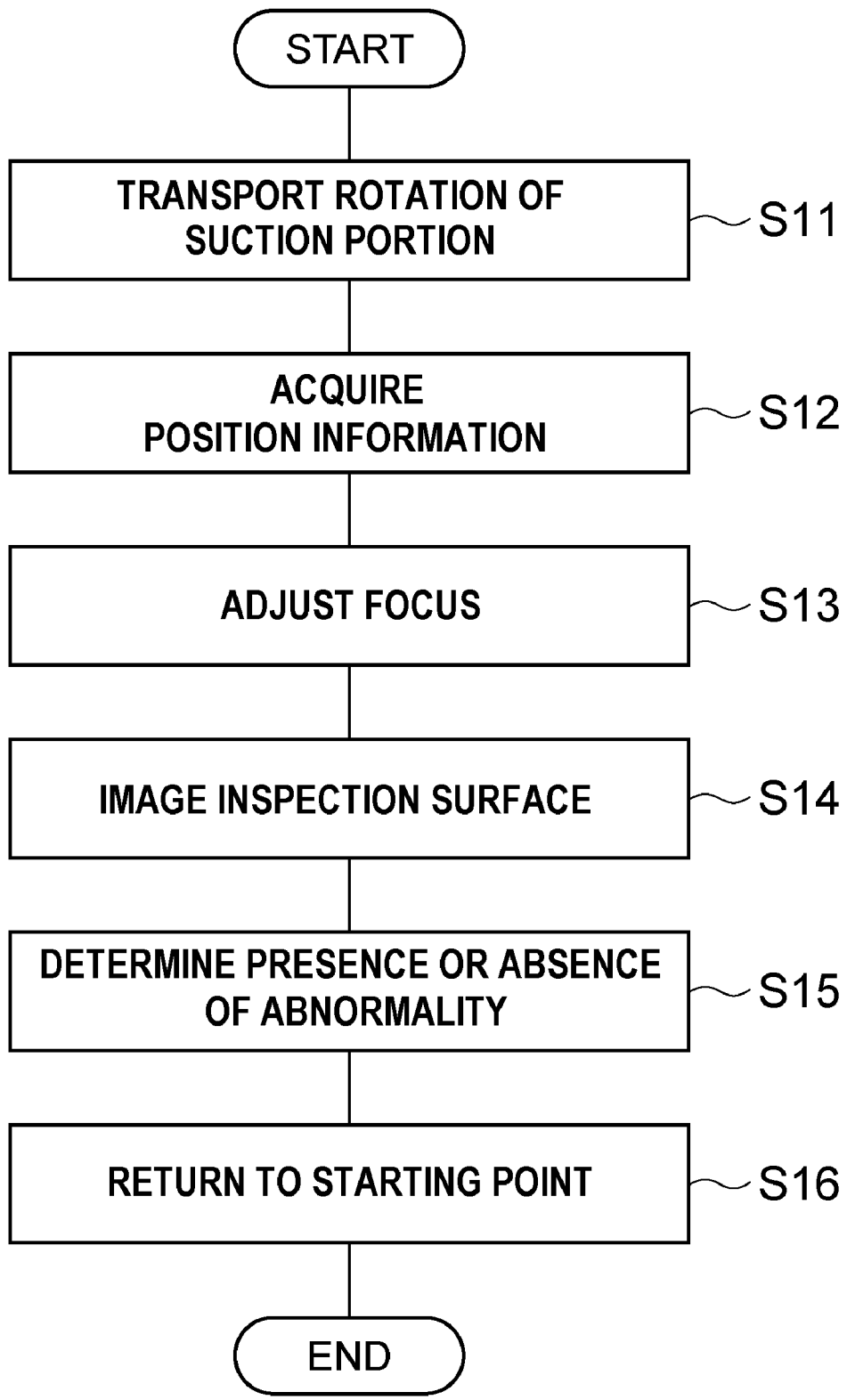
FIG. 5 is a flowchart showing an example of a series of control processing executed by the controller.

Control Method: Subsequently, an example of a control procedure (control method) executed by the controller 100 will be described. FIG. 5 is a flowchart showing a series of control processing executed by the controller 100 when the visual inspection is performed on one side surface Wc to be inspected included in one electronic component W. In this series of control processing, the controller 100 executes step S11 in a state where the suction portion 52 that holds the electronic component W to be inspected is disposed at the stop position SP located one step upstream of the inspection position IP. In step S11, for example, the transport control unit 112 controls the transport drive unit 46 such that the suction portion 52 that holds the electronic component W to be inspected is disposed at the inspection position IP.

Next, the controller 100 executes step S12. In step S12, for example, the position information acquisition unit 122 acquires the above-described position information indicating the position of the side surface Wc to be inspected in the electronic component W held by the suction portion 52 disposed at the inspection position IP, from the position sensor 30. The position information acquisition unit 122 acquires, for example, information indicating a distance from the position sensor 30 to the side surface Wc to be inspected on the optical path of the laser light emitted from the position sensor 30 and reflected by the side surface Wc to be inspected. FIG. 6A shows an example of an optical path of the laser light generated between the position sensor 30 and the side surface Wc when measuring the distance. In a case of measuring the position (distance) by the position sensor 30, an optical path Li1 extending from the position sensor 30 toward the side surface Wc to be inspected via the branch portion 32, and an optical path Lr1 collecting to the position sensor 30 from the side surface Wc to be inspected via the branch portion 32 are formed.

Next, the controller 100 executes step S13. In step S13, for example, the focus control unit 126 controls the focus adjustment unit 36 to adjust the focus of the imaging unit 24 on the side surface Wc to be inspected according to the position information obtained in step S12. The focus control unit 126 may adjust the focal position of the imaging unit 24 by moving the objective lens 26 by the drive unit 38 of the focus adjustment unit 36. In one example, the focus control unit 126 moves the objective lens 26 by the drive unit 38 along the direction in which the objective lens 26 and the camera 28 are arranged, such that the side surface Wc to be inspected is included in the depth of field DOF by the imaging unit 24. The drive amount (movement amount) of the objective lens 26 according to the position information is stored in advance in the adjustment amount storage unit 124, for example.

Next, the controller 100 executes step S14. In step S14, the imaging control unit 128 causes the imaging unit 24 to execute the imaging of the side surface Wc to be inspected, to acquire the image data of the side surface Wc. FIG. 6B shows an example of an optical path of light generated between the imaging unit 24 and the side surface Wc when the imaging by the imaging unit 24 is executed. In a case of the imaging by the imaging unit 24, an optical path Li2 extending from the illumination unit 22 to the side surface Wc, and an optical path Lr2 passing through the objective lens 26 and the branch portion 32 from the side surface Wc to be inspected and converged into the camera 28 are formed.

Next, the controller 100 executes steps S15 and S16. In step S15, for example, the abnormality determination unit 130 determines the presence or absence of an abnormality on the side surface Wc to be inspected based on the image data obtained in step S14. In step S16, for example, the focus control unit 126 controls the drive unit 38 such that the objective lens 26 is returned to the position before the execution of step S13. As a result, the series of control processing of executing the visual inspection on the side surface Wc of one electronic component W to be inspected is completed. The controller 100 may repeatedly execute the series of control processing of steps S11 to S16 for each of the subsequent plurality of electronic components W.

In a case where no abnormality is detected in step S15, the controller 100 may control the transport processing unit 2 so that the component collecting unit 14 receives the electronic component W to be inspected. In a case where an abnormality is detected in step S15, the controller 100 may control the transport processing unit 2 so that the component discharge unit 16 discharges the electronic component W to be inspected.

Modification Examples: The series of control processing shown in FIG. 5 is an example, and can be changed as appropriate. In the series of control processing, the controller 100 may execute one step and the next step in parallel, or may execute each step in an order different from the examples described above. The controller 100 may omit any step, or may execute processing different from the above-described example in any step. For example, the controller 100 may move the objective lens 26 by the drive unit 38 in step S13 for the subsequent electronic component W according to the adjustment amount for the focus adjustment and the current position of the motor of the drive unit 38 before the execution of step S13, without executing step S16.

In the above-described example, the focus adjustment is performed on the side surface Wc to be inspected by moving the objective lens 26, but the method of performing the focus adjustment of the imaging unit 24 is not limited to this example. The focus adjustment unit 36 may adjust the focal position of the imaging unit 24 by moving the lens 28a instead of or in addition to the objective lens 26. The focus adjustment unit 36 may adjust the focal position of the imaging unit 24 by moving the imaging element 28b instead of or in addition to the objective lens 26.

The focus adjustment unit 36 may move the entire camera 28, instead of or in addition to the objective lens 26, along the imaginary line IL1. As described above, the focus adjustment unit 36 moves at least one component included in the imaging unit 24 or the entire imaging unit 24, thereby driving the imaging unit 24 such that the imaging unit 24 focuses on the side surface Wc to be inspected.

Figure 7:
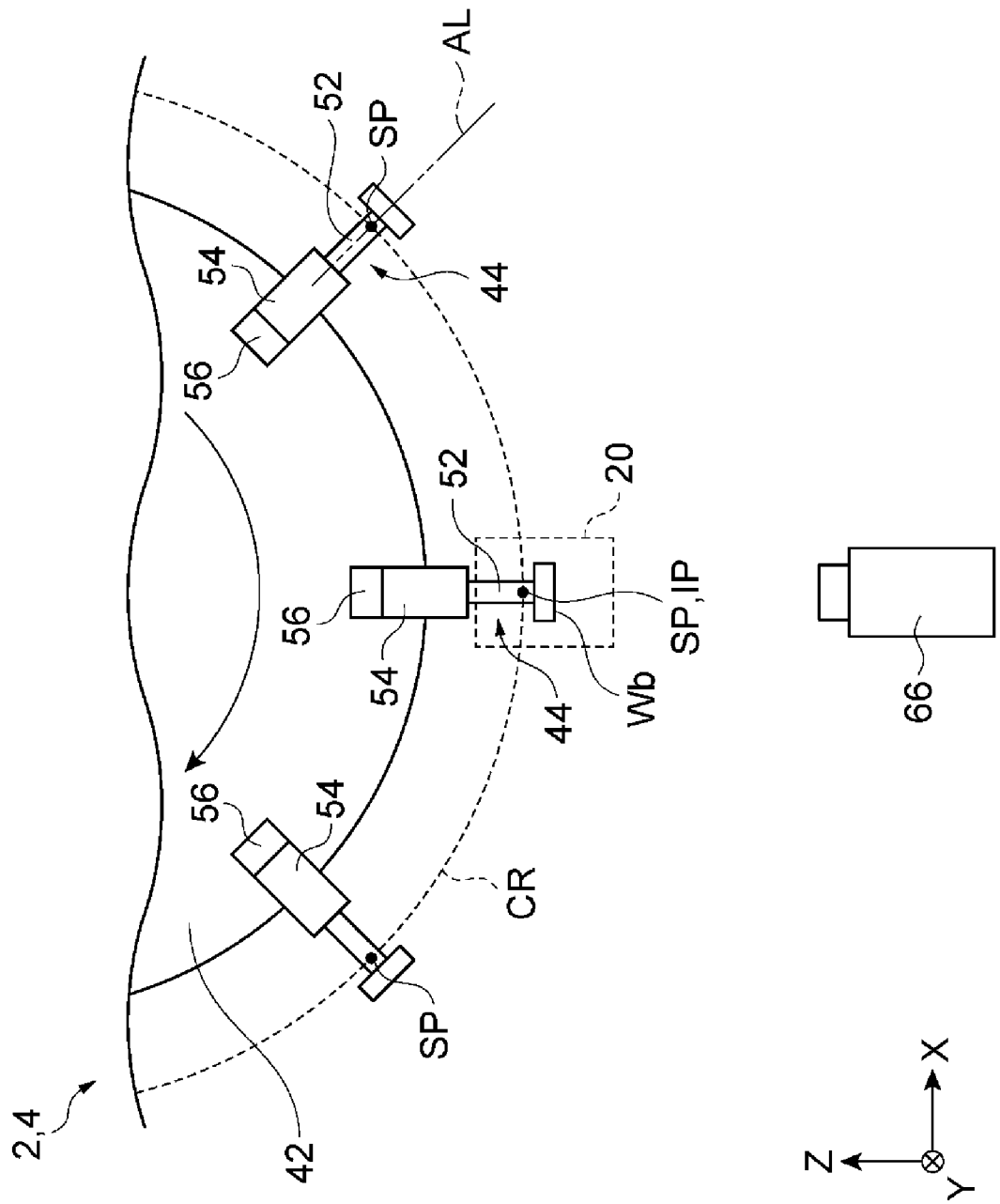
FIG. 7 is a side view schematically showing an example of a processing apparatus for an electronic component.
Figure 8:
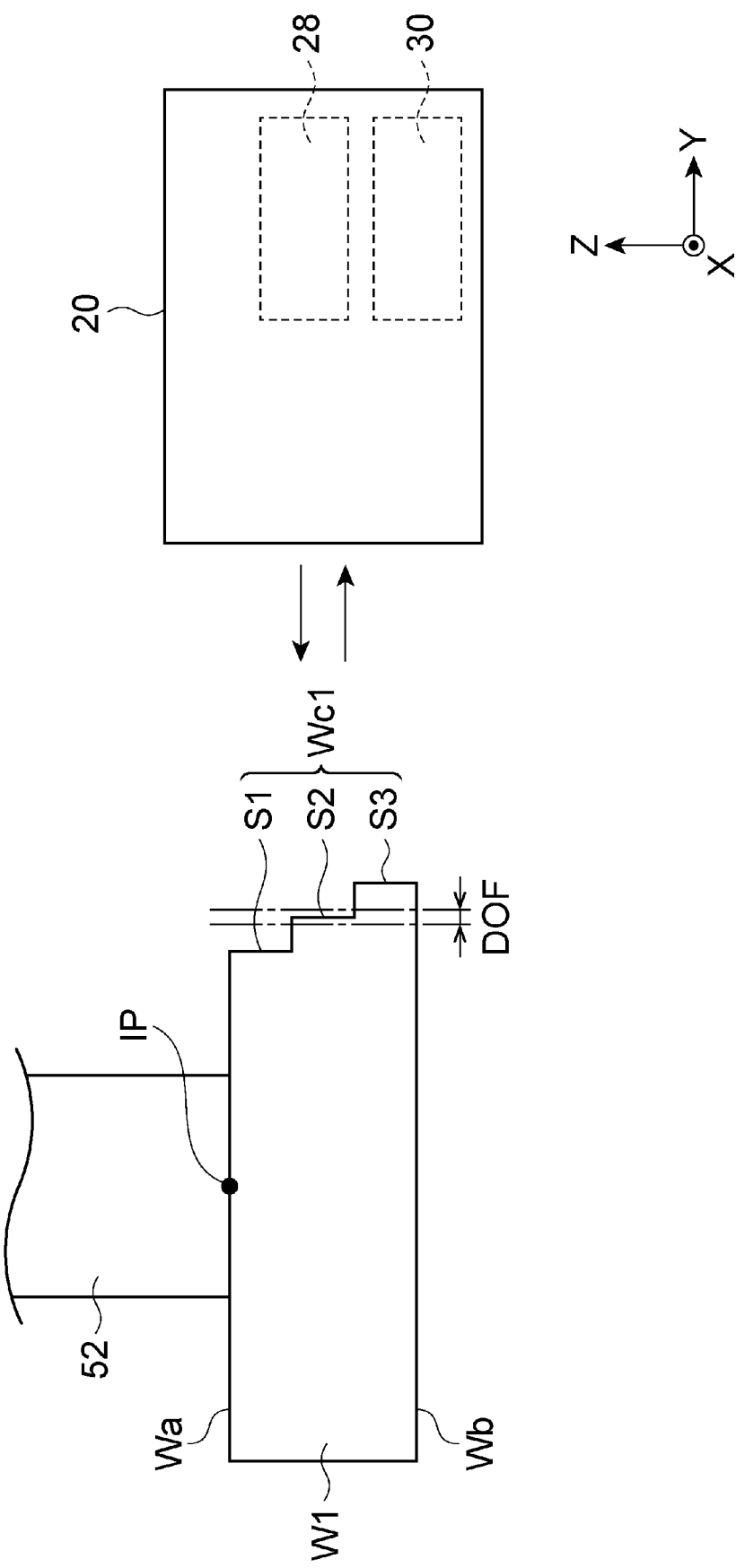
FIG. 8 is a side view schematically showing how a visual inspection is performed on an electronic component having a step.

Detection of an inclination of the inspection target surface with respect to the imaging unit 24 and adjustment of the inclination may be executed before the imaging of the inspection target surface. As shown in FIG. 7, the transport processing unit 2 may include a posture detection unit 66 (posture sensor). The posture detection unit 66 detects an inclination of the electronic component W held by the suction portion 52 disposed at the inspection position IP with respect to the imaging unit 24 for the side surface Wc of the electronic component W to be inspected. The posture detection unit 66 includes, for example, a camera (posture sensor) that can image the main surface Wb of the electronic component W held by the suction portion 52 disposed at the inspection position IP.

In a state where the suction portion 52 that holds the electronic component W to be inspected is disposed at the inspection position IP, the camera of the posture detection unit 66 images the main surface Wb facing the outside of the circular orbit CR of the electronic component W. From the image data of the main surface Wb, for example, information (posture information) indicating an inclination of the side surface Wc to be inspected from a state of directly facing the imaging unit 24 is obtained. As described above, the depth of field DOF is a narrow range, so that in a case where the inclination of the side surface Wc is large, a part of the side surface Wc may be out of the depth of field DOF. Therefore, before the imaging of the side surface Wc to be inspected, the inclination of the side surface Wc is adjusted.

The rotation transport unit 4 may include a plurality of rotation drive units 56 provided to correspond to the plurality of suction portions 52, respectively. The plurality of rotation drive units 56 may be provided on the support portion 42. The rotation drive unit 56 rotates the corresponding suction portion 52 about a central axial line AL passing through the suction portion 52 and extending along the radial direction of the circular orbit CR. The central axial line AL passes through, for example, a center of a tip surface (surface provided with a suction hole) of the suction portion 52. When the suction portion 52 that holds the electronic component W rotates about the central axial line AL, the electronic component W also rotates about the central axial line AL. As a result, the inclination of the side surface Wc facing the camera 28 of the visual inspection unit 20 with respect to the camera 28 changes. The rotation drive unit 56 functions as a posture adjustment unit that adjusts the inclination of the side surface Wc to be inspected.

As shown in FIG. 3, the controller 100 may include a posture information acquisition unit 132 and a posture control unit 134 as functional modules. The posture information acquisition unit 132 acquires information indicating the inclination of the inspection target surface with respect to the camera 28. For example, the posture information acquisition unit 132 causes the posture detection unit 66 to image the main surface Wb of the electronic component W disposed at the inspection position IP, thereby acquiring information indicating the inclination of the side surface Wc of the inspection target surface with respect to the camera 28 from the image data of the main surface Wb.

The posture control unit 134 rotates the corresponding suction portion 52 about the central axial line AL by the rotation drive unit 56 such that the posture of the side surface Wc to be inspected approaches a target posture, according to the information indicating the inclination of the inspection target surface with respect to the camera 28. For example, the posture control unit 134 rotates the suction portion 52 that holds the electronic component W about the central axial line AL by the rotation drive unit 56 at the inspection position IP such that the inclination of the side surface Wc to be inspected with respect to the imaginary line IL1 approaches 90° (such that the side surface Wc directly faces the camera 28).

In the processing apparatus 1 including the rotation drive unit 56 and the posture detection unit 66, the controller 100 may execute a series of control processing similar to the series of control processing shown in FIG. 5. The controller 100 may execute steps S02 and S03 before the execution of step S12. In step S02, for example, the posture information acquisition unit 132 acquires, from the posture detection unit 66, the posture information indicating the inclination of the side surface Wc of the electronic component W to be inspected, which is located at the inspection position IP, with respect to the camera 28. In step S03, for example, the posture control unit 134 adjusts the inclination of the side surface Wc to be inspected by the rotation of the suction portion 52 by the rotation drive unit 56 such that the side surface Wc to be inspected directly faces the camera 28.

The method of detecting the inclination of the inspection target surface and the method of adjusting the inclination are not limited to the above-described examples. The posture detection unit 66 may image the main surface Wb at the stop position SP located upstream of the inspection position IP.

The transport processing unit 2 may have a sensor that acquires the posture information indicating the inclination of the inspection target surface by irradiating the electronic component W with laser light or the like and receiving light reflected from the electronic component W or light that passes through the electronic component W, instead of the posture detection unit 66. The transport processing unit 2 may have an alignment unit (posture adjustment unit) that receives the electronic component W from the suction portion 52, adjusts the posture of the electronic component W, and then returns the electronic component W to the suction portion 52, instead of the rotation drive unit 56.

In the above-described example, the planar side surface Wc is imaged, but depending on a type of the electronic component to be processed, a step may be formed on the side surface that is the inspection target. In this case, the visual inspection unit 20 may execute imaging of each of a plurality of step surfaces forming the step. In one example, the processing apparatus 1 performs processing on an electronic component W1 shown in FIG. 8 instead of the electronic component W. The electronic component W1 has a side surface Wc1. The side surface Wc1 includes step surfaces S1, S2, and S3 (a plurality of step surfaces).

In a case where the electronic component W1 and the visual inspection unit 20 face each other at the inspection position IP, distances between each of the step surfaces S1, S2, and S3 and the camera 28 in the direction in which the electronic component W1 and the visual inspection unit 20 face each other (along the imaginary line IL1) are different from each other. In other words, the shortest distance between the step surface S1 and the camera 28, the shortest distance between the step surface S2 and the camera 28, and the shortest distance between the step surface S3 and the camera 28 are different from each other.

When the depth of field DOF is narrow, the depth of field DOF may include one step surface and may not include all other step surfaces. The controller 100 may perform control processing of adjusting the focus of the imaging unit 24 with respect to the side surface Wc1 for each step surface. The position sensor 30 of the visual inspection unit 20 may be configured to irradiate the step surface S2 of the side surface Wc1 with laser light and not to irradiate the step surfaces S1 and S3 with laser light. The position sensor 30 may acquire information indicating the position of the side surface Wc1 by measuring a distance on the optical path between the position sensor 30 and the step surface S2.

Figure 9:
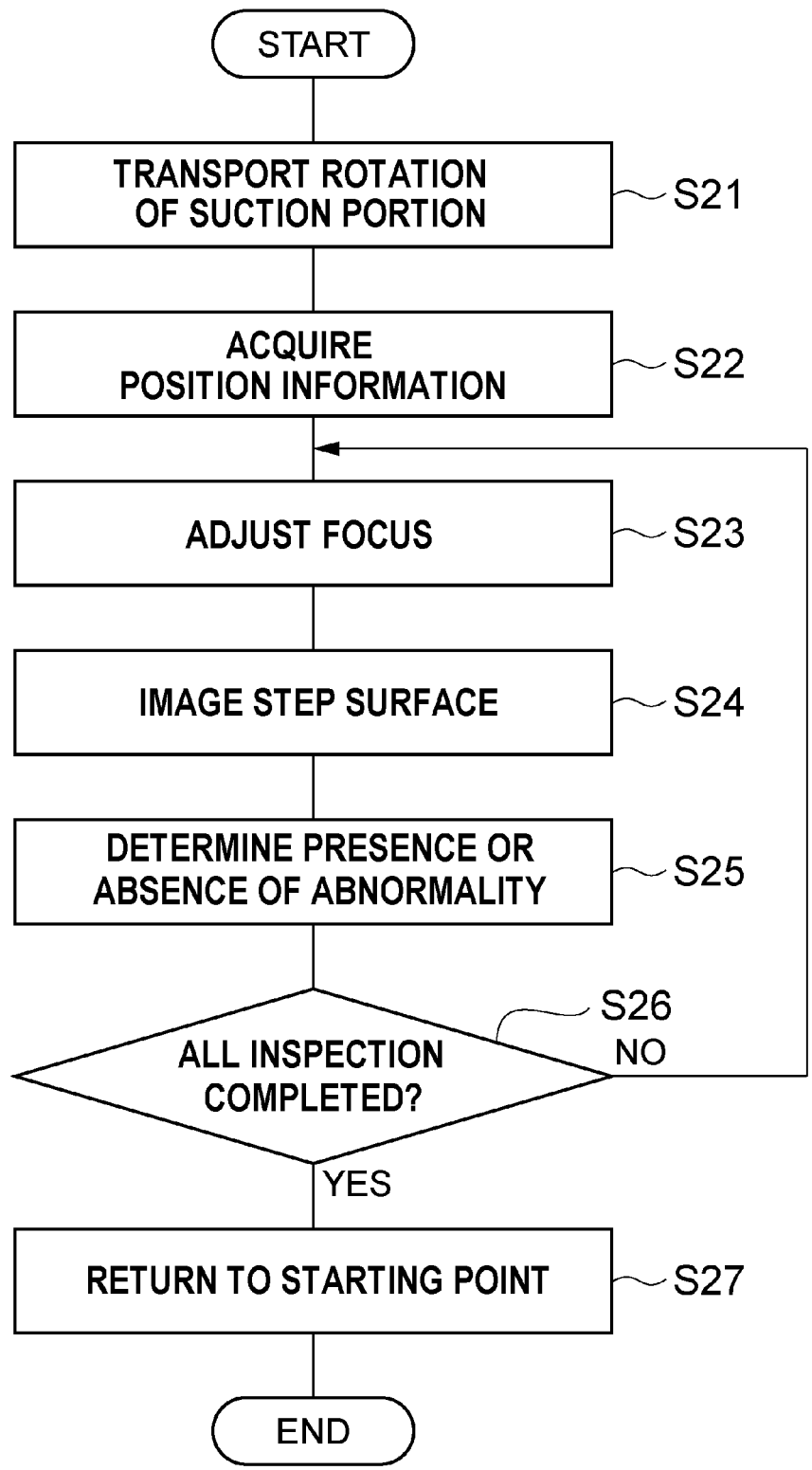
FIG. 9 is a flowchart showing an example of a series of control processing executed by the controller.

FIG. 9 is a flowchart showing an example of a series of control processing when executing the visual inspection on the electronic component W1 whose inspection target surface includes the plurality of step surfaces. In this series of control processing, the controller 100 (transport control unit 112) executes step S21 in the same manner as in step S11 such that the suction portion 52 that holds the electronic component W1 to be inspected is disposed at the inspection position IP.

Next, the controller 100 executes step S22. In step S22, for example, the position information acquisition unit 122 acquires the information indicating the position of the side surface Wc1 to be inspected in the electronic component W held by the suction portion 52 disposed at the inspection position IP, from the position sensor 30. The position information acquisition unit 122 acquires, for example, information indicating a distance from the position sensor 30 to the step surface S2 on the optical path of the laser light emitted from the position sensor 30 and reflected by the step surface S2 of the side surface Wc1 to be inspected.

Next, the controller 100 executes step S23. In step S23, for example, the focus control unit 126 controls the focus adjustment unit 36 to adjust the focal position of the imaging unit 24 according to the information indicating the position of the step surface S2. The focus control unit 126 adjusts the focus of the imaging unit 24 on the step surface S2 by moving the objective lens 26 by the drive unit 38 of the focus adjustment unit 36. In one example, the focus control unit 126 moves the objective lens 26 by the drive unit 38 along the direction in which the objective lens 26 and the camera 28 face each other, such that the step surface S2 is included in the depth of field DOF by the imaging unit 24.

Next, the controller 100 executes steps S24 and S25. In step S24, for example, the imaging control unit 128 causes the imaging unit 24 to execute the imaging of the side surface Wc1 to be inspected, to acquire the image data of the side surface Wc1 obtained by performing the focus adjustment on the step surface S2. An imaging range of the image data obtained at this time may also include the step surface S1 and the step surface S3. In step S25, for example, the abnormality determination unit 130 determines the presence or absence of an abnormality on the step surface S2 based on the image data obtained in step S24. In this case, the abnormality determination unit 130 does not determine the presence or absence of an abnormality in the step surfaces S1 and S3.

Next, the controller 100 executes step S26. In step S26, for example, the controller 100 determines whether the inspection has been performed on all the step surfaces included in the side surface Wc1. In step S26, in a case where it is determined that the inspection has not been performed for all the step surfaces (step S26: NO), the processing executed by the controller 100 returns to step S23.

The controller 100 changes the step surface to be inspected and executes the series of control processing of steps S23 to S26 for the subsequent step surface (for example, the step surface S1). The controller 100 may store information indicating a distance between the step surface S1 and the step surface S2 and a distance between the step surface S2 and the step surface S3 in the direction in which the electronic component W1 to be inspected and the camera 28 face each other. In step S23 for the step surface S1, the focus control unit 126 changes the position of the objective lens 26 such that the depth of field DOF is included in the step surface S1 based on the distance between the step surface S1 and the step surface S2.

In step S24 for the step surface S1, for example, the imaging control unit 128 causes the imaging unit 24 to execute the imaging of the side surface Wc1 to be inspected, to acquire the image data of the side surface Wc1 obtained by performing the focus adjustment on the step surface S1. In step S25 for the step surface S1, for example, the abnormality determination unit 130 determines the presence or absence of an abnormality on the step surface S2 based on the image data of the side surface Wc1 obtained by performing the focus adjustment on the step surface S1. The controller 100 executes steps S23 to S26 for the step surface S3 in the same manner as for the step surface S1.

On the other hand, in step S26, in a case where it is determined that the inspection has been performed for all the step surfaces (step S26: YES), the processing executed by the controller 100 proceeds to step S27. In step S27, for example, the focus control unit 126 controls the drive unit 38 such that the objective lens 26 is returned to the position before the first execution of step S23. In the series of control processing described above, the entire side surface Wc1 is included in the visual field, and three types of image data (a plurality of images) in which the focal positions of the imaging unit 24 are different from each other are obtained.

The controller 100 also executes the series of control processing of steps S21 to S27 for the subsequent other electronic components W1. In this case, each time any one of the plurality of suction portions 52 is disposed at the inspection position IP, the imaging unit 24 executes imaging of the side surface Wc1 a plurality of times to acquire a plurality of images in which the focal positions of the imaging unit 24 are different from each other. The imaging unit 24 executes the plurality of times of imaging after the acquisition of the position information once (acquisition of the information indicating the position of the step surface S2) for the side surface Wc1 to be imaged.

Figure 10A:
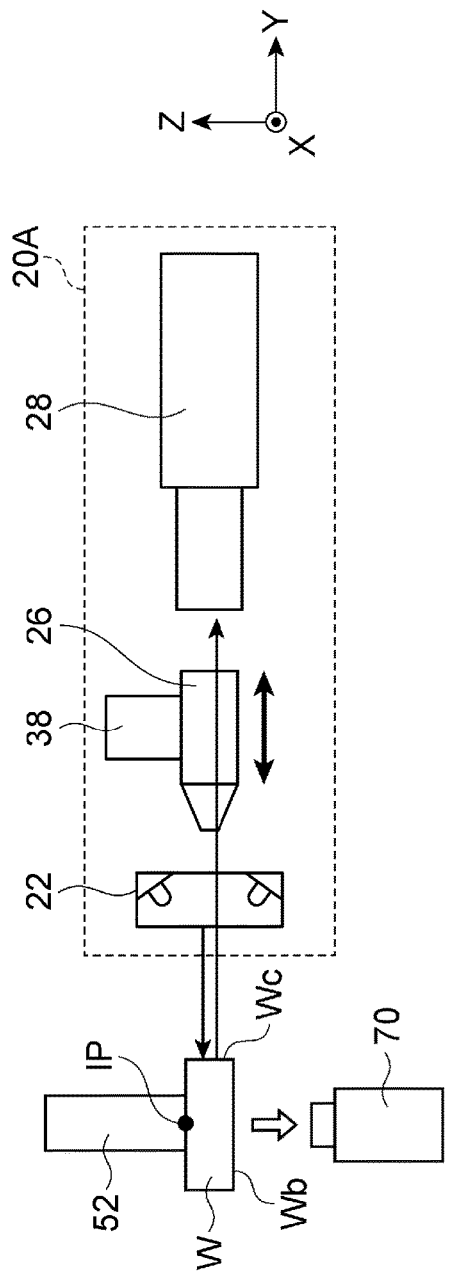
FIG. 10A is a schematic view showing an example of a visual inspection unit and a position sensor.

In the above example, the position sensor 30 acquires the position information indicating the position of the side surface Wc to be inspected by using the laser light, but the method of acquiring (detecting) the position information is not limited to this. The position information of the side surface Wc to be inspected may be acquired based on the image data from the camera disposed at a fixed position. For example, as shown in FIG. 10A, the transport processing unit 2 may include a visual inspection unit 20A instead of the visual inspection unit 20. The visual inspection unit 20A is different from the visual inspection unit 20 in that the visual inspection unit 20A does not include the position sensor 30, the branch portion 32, and the filter portion 34.

The transport processing unit 2 may include a position sensor 70 in addition to the visual inspection unit 20A. The position sensor 70 is a camera that generates image data in which the position of the side surface Wc to be inspected can be acquired. The position sensor 70 is disposed to face the main surface Wb of the electronic component W disposed at the inspection position IP, and is capable of imaging the main surface Wb. The position sensor 70 is fixed at a fixed position, and a deviation amount of the side surface Wc to be inspected from the reference position can be obtained from the image data of the main surface Wb. That is, the image data obtained by the imaging by the position sensor 70 includes the information indicating the position of the side surface Wc to be inspected.

Figure 10B:
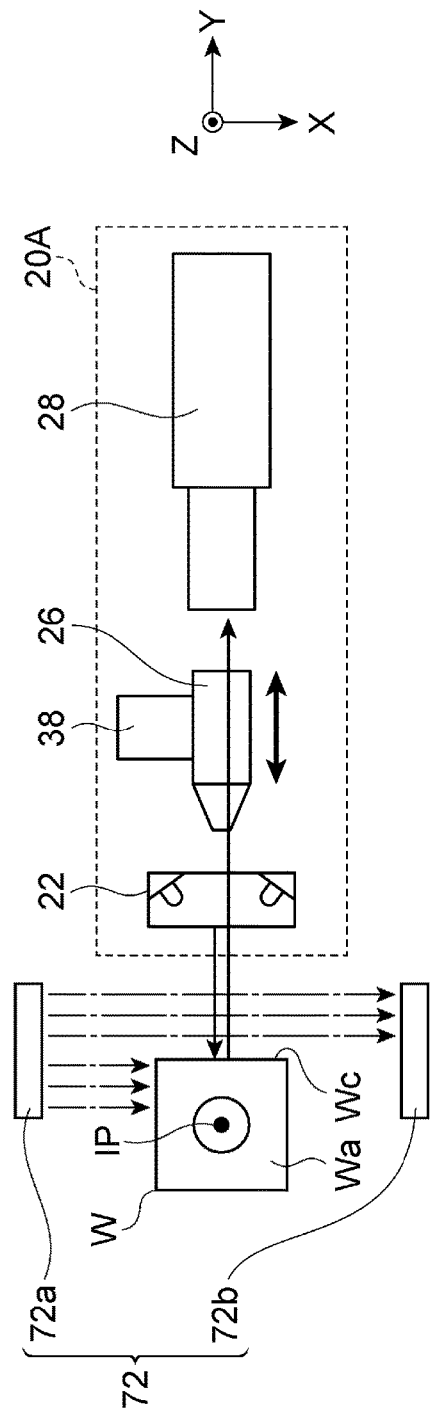
FIG. 10B is a schematic view showing an example of a visual inspection unit and a position sensor.

The transport processing unit 2 may include the visual inspection unit 20A and a position sensor 72, as shown in FIG. 10B. The position sensor 72 is a sensor that irradiates the electronic component W with irradiation light such as laser light and generates information (signal) indicating the position of the side surface Wc based on the received light. The position sensor 72 may irradiate, with light, an irradiation range extending along the imaginary line IL1 (the direction in which the side surface Wc to be inspected and the camera 28 face each other). The position sensor 72 irradiates another side surface connected to the side surface Wc to be inspected with light. The position sensor 72 may receive reflected light from the electronic component W accompanying the irradiation of the irradiation light, or a portion of the irradiation light that passes through the electronic component W without being blocked.

The position sensor 72 includes, for example, an irradiation portion 72*a* and a light receiving portion 72*b*. The irradiation portion 72*a* and the light receiving portion 72*b* are disposed to interpose the electronic component W therebetween in a direction orthogonal to the direction in which the electronic component W and the camera 28 located at the inspection position IP face each other. The irradiation portion 72*a* faces one of a pair of the side surfaces Wc connected to the side surface Wc to be inspected, and the light receiving portion 72b faces the other of the pair of side surfaces Wc. An irradiation range of light from the irradiation portion 72a is set such that the side surface Wc is included even in a case where the position of the side surface Wc to be inspected is deviated.

The irradiation portion 72a performs irradiation with irradiation light in a direction orthogonal to the opposing side surface Wc. A part of the irradiation light emitted from the irradiation portion 72a is blocked by the electronic component W, and does not reach the light receiving portion 72b. The remaining part of the irradiation light emitted from the irradiation portion 72a is not blocked by the electronic component W, and reaches the light receiving portion 72b. The light receiving portion 72b generates a signal according to the received light. The signal generated by the light receiving portion 72b changes according to the position of the side surface Wc to be inspected. In the signal generated by the light receiving portion 72b, the information indicating the position of the side surface Wc to be inspected is obtained by detecting a boundary between the region where the light is blocked and the region where the light passes without being blocked.

Any example of the various modification examples described above may be combined. For example, in the transport processing unit 2 illustrated in FIG. 10A, the detection and the adjustment of the inclination of the side surface Wc to be inspected may be performed as in the transport processing unit 2 illustrated in FIG. 7. In this case, instead of the posture detection unit 66 and the position sensor 72, one camera may acquire the information indicating the inclination and the position of the side surface Wc to be inspected by imaging the main surface Wb.

In general, in order to improve inspection accuracy in a case of inspecting an appearance of an electronic component, in a case of attempting to image an inspection surface, which is an inspection target of the electronic component, using an imaging unit capable of acquiring a high-resolution image, a depth of field by the imaging unit is narrowed. On the other hand, the position of the inspection surface may vary due to various factors, and thus the inspection surface may be out of the depth of field. With respect to this, the processing apparatus 1 according to the embodiment and the modification examples of the present disclosure includes the position sensors 30, 70, and 72 that acquire the position information indicating the position of the inspection surface, and the focus adjustment unit 36 that adjusts the focus of the imaging unit 24 on the inspection surface of the electronic component W. The position of the depth of field DOF by the imaging unit 24 is changed through the focus adjustment by the focus adjustment unit 36. Therefore, the above-described focus adjustment can be performed such that the inspection surface is included in the depth of field DOF according to the acquired position information. As a result, it is possible to image the inspection surface in a state where the inspection surface is included in the depth of field DOF. Therefore, the processing apparatus 1 is useful for improving the inspection accuracy.

The position sensors 30, 70, and 72 acquire the position information in a state where the component holding portion 44 (suction portion 52) that holds the electronic component W is disposed at the inspection position IP. In this case, since the position information is acquired at the same position as in a case of imaging the inspection surface of the electronic component W, the position of the inspection surface can be detected with high accuracy, and the depth of field can be accurately adjusted to the inspection surface. Therefore, it is further useful for improving the inspection accuracy.

The focus adjustment unit 36 drives the imaging unit 24 to adjust the focus of the imaging unit 24 on the inspection surface. The components included in the imaging unit 24 tend to be smaller than the unit that rotationally transports the electronic component W. Therefore, the position of the depth of field DOF can be finely adjusted, so that the depth of field DOF can be accurately adjusted to the inspection surface. Therefore, it is further useful for improving the inspection accuracy.

The processing apparatus 1 further includes the posture sensor (posture detection unit 66) that acquires the posture information indicating the posture of the inspection surface with respect to the camera 28, and the posture adjustment unit (rotation drive unit 56) that adjusts the posture of the inspection surface. When the depth of field DOF is narrow, a part of the inspection surface may be out of the depth of field DOF depending on the posture of the inspection surface. With the above-described configuration, the posture of the inspection surface can be adjusted according to the posture information, so that a decrease in accuracy due to the posture deviation of the inspection surface with respect to the depth of field DOF can be suppressed. Therefore, it is further useful for improving the inspection accuracy.

The processing apparatus 1 includes the plurality of component holding portions 44. The imaging unit 24 executes the imaging of the inspection surface after the focus adjustment is performed by the focus adjustment unit 36, each time any one of the plurality of component holding portions 44 is disposed at the inspection position IP. In this case, since the inspection surface can be imaged by performing the focus adjustment on the inspection surface for each of the component holding portions 44, a variation in inspection accuracy between electronic components W can be suppressed. Therefore, it is useful for stabilizing the inspection accuracy by imaging the inspection surface.

Each time any one of the plurality of component holding portions 44 is disposed at the inspection position IP, the imaging unit 24 executes imaging of the inspection surface a plurality of times to acquire a plurality of images in which the focal positions of the imaging unit 24 are different from each other. In this case, even in a case where the inspection surface includes step surfaces having different distances from the imaging unit 24, the imaging can be executed by adjusting the focus of the imaging unit 24 for each step surface. Therefore, it is useful for improving the inspection accuracy in the visual inspection on the inspection surface including the step.

After the position sensor 30 acquires the position information about the inspection surface once, the imaging unit 24 executes imaging of the inspection surface a plurality of times. In this case, the time required for the visual inspection of the inspection surface is shortened as compared with a case where the position information is acquired a plurality of times in response to the plurality of times of imaging for one inspection surface. Therefore, it is useful for improving a processing efficiency.

Second Embodiment

Figure 11:
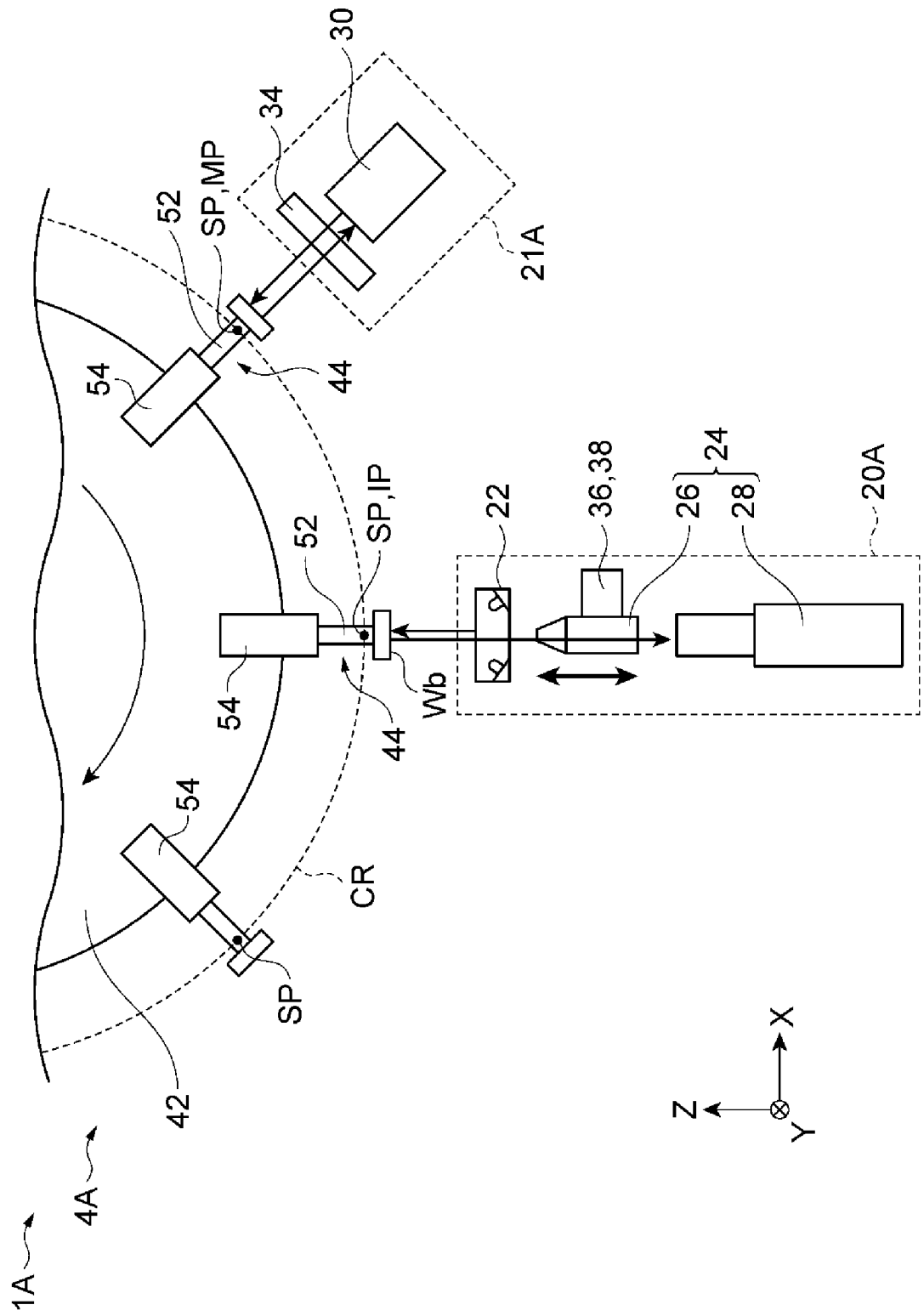
FIG. 11 is a side view schematically showing an example of a processing apparatus for an electronic component according to a second embodiment.

Subsequently, a processing apparatus for an electronic component according to a second embodiment will be described with reference to FIG. 11. A processing apparatus 1A shown in FIG. 11 acquires information indicating the position of the side surface Wc to be inspected at the stop position SP different from the inspection position IP. The processing apparatus 1A includes, for example, a visual inspection unit 20A and a measurement unit 21A instead of the visual inspection unit 20. The visual inspection unit 20A is disposed to correspond to the inspection position IP, and executes the visual inspection for the main surface Wb facing the outside of the circular orbit CR. The visual inspection unit 20A is configured similarly to the visual inspection unit 20A shown in FIG. 10A or FIG. 10B, except that the inspection target is the main surface Wb.

The measurement unit 21A is disposed to correspond to the stop position SP located one step upstream of the inspection position IP, and measures the position of the main surface Wb to be inspected at the stop position SP. Hereinafter, the stop position SP at which the measurement unit 21A performs the measurement is referred to as a "measurement position MP". The measurement unit 21A includes a position sensor 30 and a filter portion 34. The position sensor 30 of the measurement unit 21A acquires information (position information) indicating the position of the main surface Wb to be inspected in a state where the component holding portion 44 (suction portion 52) that holds the electronic component W to be inspected is disposed at the measurement position MP. The filter portion 34 is disposed between the position sensor 30 and the main surface Wb.

The position of the main surface Wb when the suction portion 52 that holds the electronic component W to be inspected is disposed at the measurement position MP is correlated with the position of the main surface Wb with respect to the camera 28 in a state where the suction portion 52 is disposed at the inspection position IP. Therefore, even in a case where the information indicating the position of the main surface Wb is acquired at the measurement position MP, the depth of field DOF (focus of the imaging unit 24) by the imaging unit 24 can be adjusted to the main surface Wb to be inspected, according to the position information.

A series of control processing similar to the series of control processing shown in FIG. 5 described above may also be executed in the processing apparatus 1A. In this case, the controller 100 may execute step S01 before the execution of step S11 without executing step S12. In step S01, for example, the position information acquisition unit 122 acquires the position information indicating the position of the main surface Wb of the electronic component W held by the suction portion 52 disposed at the measurement position MP, from the position sensor 30 of the measurement unit 21A. In step S13, for example, the focus control unit 126 moves the objective lens 26 by the drive unit 38 of the focus adjustment unit 36, and adjusts the focus of the imaging unit 24 on the main surface Wb to be inspected according to the position information obtained in step S01.

Various modification examples according to the first embodiment may also be applied to the processing apparatus 1A according to the second embodiment. Similarly to the processing apparatus 1 according to the first embodiment, the processing apparatus 1A is also useful for improving the inspection accuracy.

The position sensor 30 acquires the position information indicating the position of the inspection surface in a state where the component holding portion 44 that holds the electronic component W is disposed at a position (measurement position MP) different from the inspection position IP on the circular orbit CR. In this case, the acquisition of the position information at the measurement position MP and the imaging at the inspection position IP can be executed in parallel for separate electronic components W. Therefore, the processing time can be shortened as compared with a case where the acquisition of the position information and the imaging of the imaging unit 24 are performed in order at the inspection position IP. Therefore, it is useful for improving a processing efficiency.

Third Embodiment

Subsequently, a processing apparatus for an electronic component according to a third embodiment will be described with reference to FIGS. 12 and 13. A processing apparatus 1B shown in FIG. 12 adjusts the focus of the imaging unit 24 on the inspection target surface by driving the component holding portion that holds the electronic component W. The processing apparatus 1B includes a transport processing unit 2B instead of the transport processing unit 2. The transport processing unit 2B includes a support portion 42B, a plurality of component holding portions 44B, a transport drive unit 46B, a plurality of lifting drive units 58, and a plurality of processing units 6.

The support portion 42B supports the plurality of component holding portions 44B such that the plurality of component holding portions 44B are located on a horizontal circular orbit CR2. The support portion 42B is provided to be rotatable about a central axis Ax2 of the circular orbit CR2. The central axis Ax2 may be a vertical axial line (may extend in the vertical direction). The support portion 42B is, for example, a turntable. The plurality of component holding portions 44B are disposed in the same manner as the plurality of component holding portions 44 described above, and are fixed to an outer peripheral portion of the support portion 42B.

Figure 13:
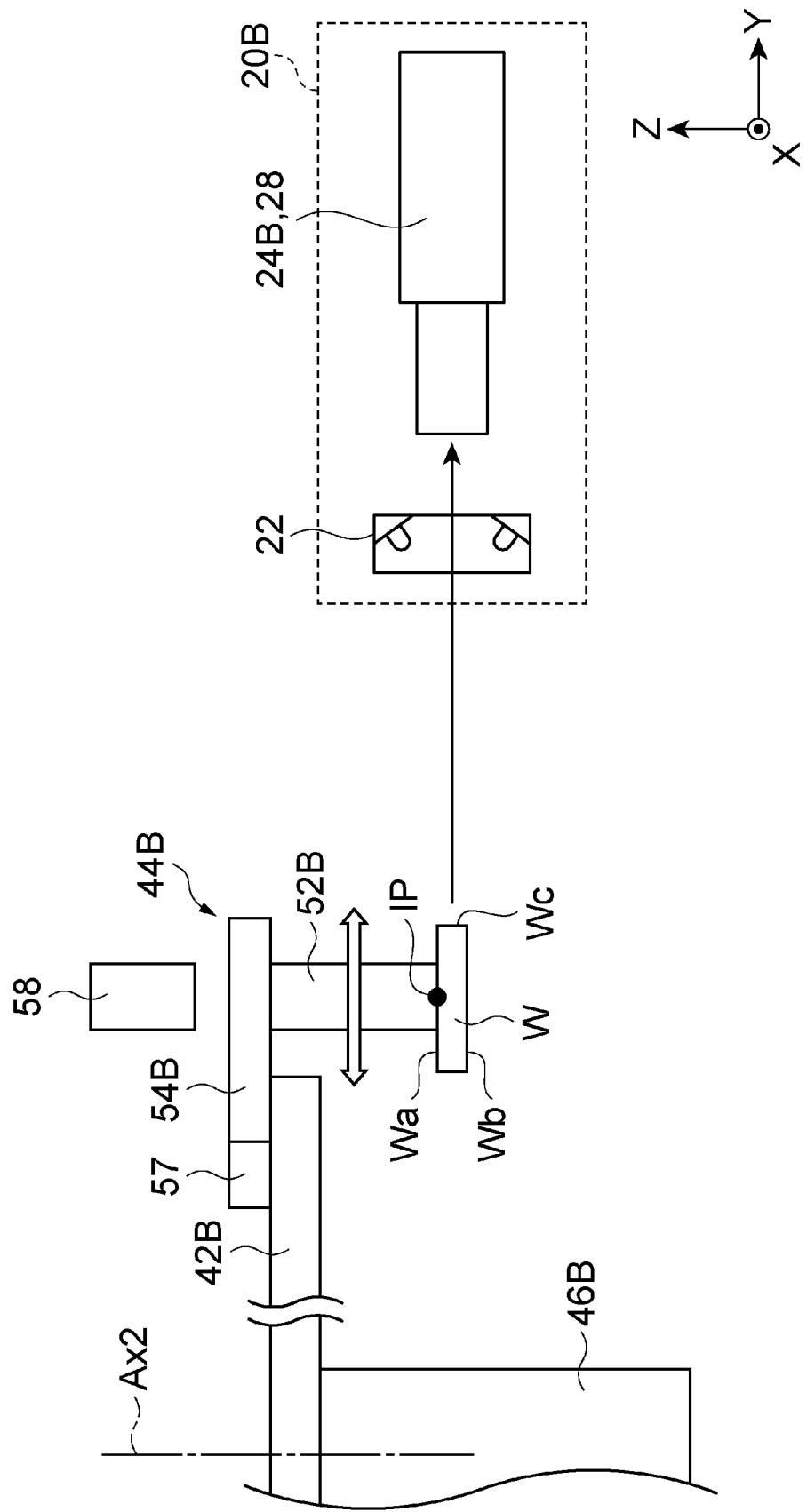
FIG. 13 is a side view schematically showing how the electronic component is inspected.

The component holding portion 44B includes, for example, a suction portion 52B and a holder 54B, as shown in FIG. 13. The suction portion 52B (component holding portion) is configured similarly to the suction portion 52 except for a direction in which a suction hole faces. The suction portion 52B holds the electronic component W by sucking the main surface Wa from one side in a direction perpendicular to the support portion 42. The holder 54B holds the suction portion 52B such that the suction portion 52B can be moved up and down, and is fixed to the support portion 42B so as to be movable along the radial direction of the circular orbit CR2.

The transport processing unit 2B includes an advance/retract drive unit 57. The advance/retract drive unit 57 moves the component holding portion 44B (suction portion 52B) along the radial direction of the circular orbit CR2. The advance/retract drive unit 57 may be provided on the support portion 42B, and is configured to apply an outward driving force to the holder 54B. When the advance/retract drive unit 57 moves the suction portion 52B along the radial direction of the circular orbit CR2, a distance between the central axis Ax2 and the side surface Wc of the electronic component W held by the suction portion 52B facing the outside of the circular orbit CR2 is changed.

The transport drive unit 46B intermittently rotates the support portion 42B about the central axis Ax2 of the circular orbit CR2, similarly to the transport drive unit 46. The intermittent rotation means that the movement and the stop are alternately repeated along the circumference around the central axis. The electronic component W held by the component holding portion 44B (suction portion 52B) is transported along the circular orbit CR2 by the rotation of the transport drive unit 46B. Hereinafter, a position at which each of the plurality of component holding portions 44B stops when the transport drive unit 46B intermittently rotates the support portion 42B is also referred to as a "stop position SP".

The lifting drive unit 58 moves the suction portion 52B along the direction (the vertical direction: a Z axis direction in the drawing) in which the component holding portion 44B and the electronic component W held by the component holding portion 44B face each other. The lifting drive unit 58 is disposed above the stop position SP, and may lower the suction portion 52B by applying a downward force to the suction portion 52B of the component holding portion 44B disposed at the stop position SP.

Figure 12:
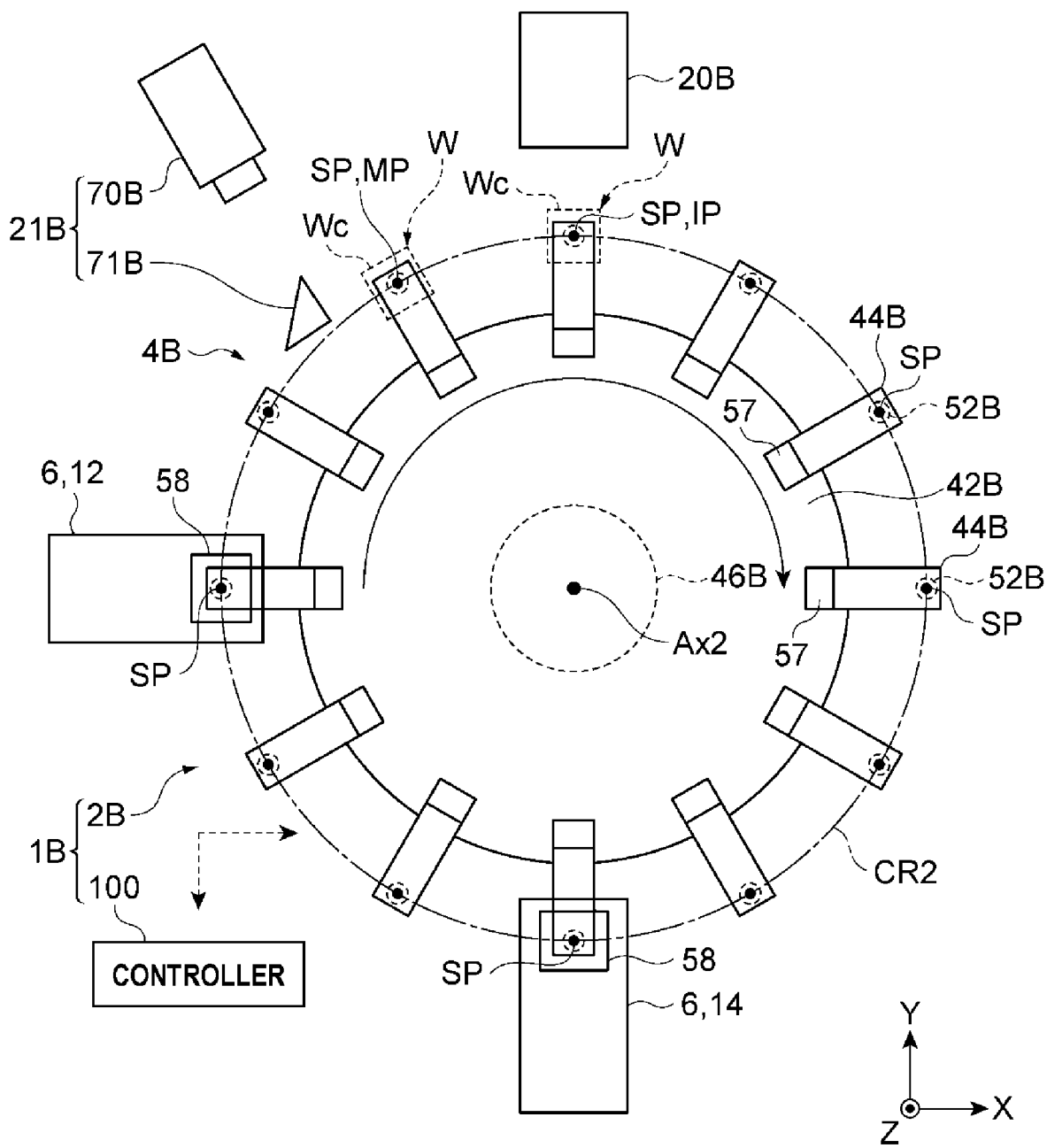
FIG. 12 is a plan view schematically showing an example of a processing apparatus for an electronic component according to a third embodiment.

As shown in FIG. 12, the plurality of processing units 6 include a component supply unit 12, a component collecting unit 14, a visual inspection unit 20B, and a measurement unit 21B. The visual inspection unit 20B is disposed to correspond to any stop position SP (inspection position IP) between the stop position SP for supply and the stop position SP for return in the circular orbit CR2. The visual inspection unit 20B is different from the visual inspection unit 20A in that the visual inspection unit 20B does not have the objective lens 26 (see FIG. 13). In this case, the visual inspection unit 20B includes an illumination unit 22 and an imaging unit 24B.

The imaging unit 24B does not include the objective lens 26 but includes the camera 28. The visual inspection unit 20B does not have a function of changing the focal position of the imaging unit, unlike the visual inspection units 20 and 20A. The visual inspection unit 20B may execute the visual inspection with respect to the side surface Wc facing the outside of the circular orbit CR2. In this case, the camera 28 of the imaging unit 24B images the side surface Wc facing a direction away from the central axis Ax2. The imaging unit 24B (camera 28) of the visual inspection unit 20B and the side surface Wc of the electronic component W to be inspected, which is disposed at the inspection position IP, face each other along the radial direction of the circular orbit CR2.

The measurement unit 21B is disposed to correspond to the stop position SP (measurement position MP) located one step upstream of the inspection position IP in the circular orbit CR2. The measurement unit 21B acquires information (position information) indicating the position of the side surface Wc to be inspected facing the outside of the circular orbit CR2 at the measurement position MP. The measurement unit 21B includes a camera 70B and a mirror 71B. The camera 70B images another side surface Wc (for example, the side surface Wc facing the upstream side in the circular orbit CR2) connected to the side surface Wc to be inspected via the mirror 71B. Image data obtained by imaging the other side surface Wc with the camera 70B includes information indicating the position of the side surface Wc to be inspected.

In the processing apparatus 1B, the suction portion 52B is moved along the radial direction of the circular orbit CR2 by the advance/retract drive unit 57, so that a distance between the side surface Wc of the electronic component W to be inspected, which is held by the suction portion 52B, and the camera 28 of the imaging unit 24B is changed. The advance/retract drive unit 57 moves the suction portion 52B to adjust the focus of the imaging unit 24 on the side surface Wc to be inspected. The advance/retract drive unit 57 functions as a focus adjustment unit.

In the processing apparatus 1B as well, the above-described series of control processing executed in the processing apparatus 1A according to the second embodiment may be executed. In this case, in step S01, the position information acquisition unit 122 acquires the position information indicating the position of the side surface Wc of the electronic component W to be inspected, which is held by the suction portion 52B disposed at the measurement position MP, from the camera 70B (position sensor) of the measurement unit 21B. In step S13, for example, the focus control unit 126 controls the advance/retract drive unit 57 such that the side surface Wc to be inspected is included in the depth of field DOF by the imaging unit 24B, according to the position information obtained in step S01. The advance/retract drive unit 57 changes the position of the suction portion 52 in the radial direction, thereby adjusting the position of the side surface Wc to be inspected with respect to the focal position of the imaging unit 24.

In the example described above, the distance between the side surface Wc and the focal position of the imaging unit 24B is adjusted by moving the suction portion 52B along the radial direction of the circular orbit CR2 with the advance/retract drive unit 57, but another drive unit (focus adjustment unit) may move the suction portion 52B according to the surface of the target of the visual inspection. In one example, in a case where the inspection target surface is the main surface Wb and the visual inspection unit 20B is disposed to face the main surface Wb, the lifting drive unit 58 (focus adjustment unit) may move the suction portion 52B to change the distance between the side surface Wc to be inspected and the focal position of the imaging unit 24B. In this case, the lifting drive unit 58 may be disposed above the inspection position IP.

In the processing apparatus 1B according to the third embodiment, the contents described in the first embodiment, the modification examples of the first embodiment, and the second embodiment may be applied. Similarly to the processing apparatus 1 according to the first embodiment, the processing apparatus 1B is also useful for improving the inspection accuracy.

The focus adjustment unit drives the component holding portion 44B (suction portion 52B) to change the position of the inspection surface with respect to the imaging unit 24B. In this case, it is not necessary to provide a member that adjusts the focal position of the imaging unit 24B in the unit that performs the visual inspection, which is useful for simplifying the unit that performs the visual inspection.

What is claimed is:

1. A processing apparatus for an electronic component, the apparatus comprising:
    a component holding portion including a suction portion configured to hold an electronic component;
    a rotation drive unit configured to rotate the suction portion;
    a support portion configured to support the component holding portion such that the component holding portion is located on a circular orbit passing through an inspection position;
    a transport drive unit configured to rotate the support portion about a central axis of the circular orbit; and
    a plurality of processing units provided to correspond to a plurality of stop positions; each processing unit of the plurality of processing units including a visual inspection unit, the transport drive unit being configured to stop the component holding portion at the plurality of stop positions; each visual inspection unit including
        an imaging unit configured to image an inspection surface of the electronic component held by the component holding portion disposed at the inspection position;
        a position sensor configured to acquire position information indicating a position of the inspection surface of the electronic component held by the component holding portion;

a focus adjustment unit configured to adjust a focus of the imaging unit on the inspection surface based on the position information indicating the position of the inspection surface of the electronic component held by the component holding portion; and a branch portion, wherein the position sensor is configured to acquire the position information in a state where the component holding portion that holds the electronic component is disposed at the inspection position, and wherein the branch portion is configured to branch light from the inspection surface into first light that travels to the imaging unit and second light that travels to the position sensor.

2. The processing apparatus according to claim 1, wherein the position sensor is configured to acquire the position information in a state where the component holding portion that holds the electronic component is disposed at a position different from the inspection position on the circular orbit.

3. The processing apparatus according to claim 1, wherein the focus adjustment unit is configured to drive the imaging unit to adjust the focus of the imaging unit on the inspection surface.

4. The processing apparatus according to claim 1, wherein the focus adjustment unit is configured to drive the component holding portion to adjust the focus of the imaging unit on the inspection surface.

5. The processing apparatus according to claim 1, further comprising:
  a posture sensor configured to acquire posture information indicating a posture of the inspection surface with respect to the imaging unit; and
  a posture adjustment unit configured to adjust the posture of the inspection surface with respect to the imaging unit.

6. The processing apparatus according to claim 1, wherein a plurality of component holding portions including the component holding portion are provided, and
  wherein, each time any one of the plurality of component holding portions is disposed at the inspection position, the imaging unit executes imaging of the inspection surface after the focus adjustment unit performs the focus adjustment.

7. The processing apparatus according to claim 6, wherein, each time any one of the plurality of component holding portions is disposed at the inspection position, the imaging unit executes imaging of the inspection surface a plurality of times to acquire a plurality of images in which focal positions of the imaging unit are different from each other.

8. The processing apparatus according to claim 7, wherein, after the position sensor acquires the position information about the inspection surface once, the imaging unit executes imaging of the inspection surface a plurality of times.

9. The processing apparatus according to claim 1, wherein the imaging unit includes an objective lens and a camera,
  wherein the branch portion is disposed between the objective lens and the camera along an imaginary line on which the inspection surface and the camera are arranged.

10. The processing apparatus according to claim 9, wherein the focus adjustment unit includes a drive unit, and
  wherein the drive unit is configured to change a position of the objective lens along the imaginary line to adjust the focus of the imaging unit.

11. The processing apparatus according to claim 10, further comprising:
  a filter portion disposed between the inspection surface and the position sensor,
  wherein the filter portion is configured to transmit light having a frequency range of laser light used by the position sensor for distance measurement and to attenuate light having a frequency other than the frequency range.

12. A processing apparatus for an electronic component, the apparatus comprising:
  a transport drive unit;
  a support portion provided to be driven by the transport drive unit to rotate about a central axis of a circular orbit passing through an inspection position;
  a component holding portion supported by the support portion on the circular orbit; the component holding portion including a suction portion configured to hold an electronic component;
  a posture sensor;
  a posture adjustment unit provided in the support portion and including a rotation drive unit configured to rotate the suction portion; and
  a plurality of processing units provided to correspond to a plurality of stop positions; each processing unit of the plurality of processing units including a visual inspection unit, the transport drive unit being configured to stop the component holding portion at the plurality of stop positions; each visual inspection unit including
    an imaging unit;
    a position sensor;
    a focus adjustment unit; and
  a branch portion,
  wherein the imaging unit is configured to image an inspection surface of the electronic component held by the component holding portion disposed at the inspection position;
  wherein the position sensor is configured to acquire position information indicating a position of the inspection surface in a condition that the electronic component is held by the component holding portion;
  wherein the focus adjustment unit is configured to adjust a focus of the imaging unit on the inspection surface based on the position information in the condition that the electronic component is held by the component holding portion,
  wherein the posture sensor is configured to acquire posture information indicating a posture of the inspection surface with respect to the imaging unit in the condition that the electronic component is held by the component holding portion,
  wherein the posture adjustment unit is configured to adjust the posture of the inspection surface with respect to a depth of field by the imaging unit based on the posture information by rotating the component holding portion holding the electronic component around a central axial line of the component holding portion, prior to an imaging of the inspection surface by the imaging unit,
  wherein the position sensor is configured to acquire the position information in a state where the component holding portion that holds the electronic component is disposed at the inspection position,
  wherein the branch portion is configured to branch light from the inspection surface into first light that travels to the imaging unit and second light that travels to the position sensor, and wherein an optical path of laser light to be used for acquiring the position information in the position sensor coincides with an optical axis of a camera of the imaging unit between the inspection surface and the branch portion.

* * * * *